United States Patent
Kutscha et al.

(10) Patent No.: US 11,204,334 B2
(45) Date of Patent: Dec. 21, 2021

(54) METHOD AND SYSTEM FOR DETERMINING A QUALITY OF AN ABRASIVE SURFACE PREPARATION OF A COMPOSITE SURFACE USING ELECTRICAL RESISTANCE AND SURFACE RESISTIVITY

(71) Applicant: The Boeing Company, Chicago, IL (US)

(72) Inventors: Eileen O. Kutscha, Seattle, WA (US); Tyler J. Zimmerman, Edmonds, WA (US); Richard A. Miller, II, Seattle, WA (US); Kay Y. Blohowiak, Issaquah, WA (US)

(73) Assignee: The Boeing Company, Chicago, IL (US)

( * ) Notice: Subject to any disclaimer, the term of this patent is extended or adjusted under 35 U.S.C. 154(b) by 145 days.

(21) Appl. No.: 16/544,859

(22) Filed: Aug. 19, 2019

(65) Prior Publication Data
US 2021/0055244 A1 Feb. 25, 2021

(51) Int. Cl.
*G01N 27/20* (2006.01)
*G01R 27/08* (2006.01)
(Continued)

(52) U.S. Cl.
CPC ........... *G01N 27/20* (2013.01); *B32B 7/12* (2013.01); *G01N 27/041* (2013.01); *G01R 27/08* (2013.01)

(58) Field of Classification Search
CPC ........ G01N 27/20; G01N 27/041; B32B 7/12; G01R 27/08
(Continued)

(56) References Cited

U.S. PATENT DOCUMENTS 3,616,197 A * 10/1971 Amberg ............... B32B 27/32
428/201
3,852,151 A * 12/1974 Knapp ............... B32B 15/09
428/148

(Continued)

OTHER PUBLICATIONS

Broughton, W. R., and Maria J. Lodeiro. "Assessment of characterisation techniques for evaluating surface treatments for adhesive bonding." (2003). (Year: 2003).*

(Continued)

*Primary Examiner* — Christopher P McAndrew

(57) ABSTRACT

There is provided a method for determining a quality of an abrasive surface preparation of a composite surface, prior to the composite surface undergoing a post-processing operation. The method includes fabricating levels of abrasive surface preparation standards for a reference composite surface; using a surface analysis tool in the form of an ohm meter, to create target values for quantifying the levels; and measuring, with the surface analysis tool, one or more abrasive surface preparation locations on the composite surface of a test composite structure, to measure one or more of, electrical resistance and surface resistivity, of the composite surface, to obtain test result measurement(s). The method further includes comparing the test result measurement(s) to the levels, to obtain test result level(s); determining if the test result level(s) meet the target value(s); and determining whether the composite surface is acceptable to proceed with the post-processing operation.

20 Claims, 18 Drawing Sheets

(51) Int. Cl.
*G01N 27/04* (2006.01)
*B32B 7/12* (2006.01)
(58) Field of Classification Search
USPC .......................................................... 324/127
See application file for complete search history.

(56) References Cited

U.S. PATENT DOCUMENTS

| | | | |
|---|---|---|---|
| 4,197,341 A * | 4/1980 | Rule .......................... | B32B 3/12 |
| | | | 428/118 |
| 5,393,980 A | 2/1995 | Yost et al. | |
| 6,500,556 B1 * | 12/2002 | Morris .................... | B32B 37/12 |
| | | | 428/463 |
| 6,655,218 B1 | 12/2003 | Ogisu et al. | |
| 7,075,086 B2 | 7/2006 | Shelley et al. | |
| 7,157,717 B2 | 1/2007 | Shelley et al. | |
| 9,591,273 B1 | 3/2017 | Wu et al. | |
| 2011/0049437 A1 * | 3/2011 | Crain ....................... | C09D 5/24 |
| | | | 252/511 |
| 2011/0089958 A1 | 4/2011 | Malecki et al. | |
| 2016/0159052 A1 * | 6/2016 | Kim ........................ | B32B 37/26 |
| | | | 361/679.01 |

OTHER PUBLICATIONS

Broughton, W. R., and M. J. Lodeiro. "Review of surface characterisation techniques for adhesive bonding." (2002). (Year: 2002).*

Broughton, W. R., et al. "Assessment of surface characterisation techniques for adhesive bonds." (2002). (Year: 2002).*

Kai Brune, et al., "Surface Analytical Approaches Contributing to Quality Assurance During Manufacture of Functional Interfaces", Applied Adhesion Science, 2015, p. 1-17, 3:2, Springer, Berlin, Germany.

Brenda M. Parker, et al., Abstract for "Testing Epoxy Composite Surfaces for Bondability", Surface and Interface Analysis, Jun. 16, 1991, p. 471-476, vol. 17, No. 17, Elsevier Inc., Amsterdam, Netherlands.

C.D. Wingard, et al., Abstract for "Use of Photo-Electron Emission to Determine the Effects of Contamination on Bond Strength and Integrity of Metal/Polymer Composite Specimen", Polymeric Materials Science and Engineering, Proceedings of the ACS Division of Polymeric Materials Science and Engineering, 1991, p. 389-390, vol. 64, Elsevier Inc., Amsterdam, Netherlands.

Birgit K. Storm, et al., Abstact for "Wear Test of Composites", Academic Journal of Manufacturing Engineering, 2010, p. 91-96, vol. 8, No. 4, Elsevier Inc., Amsterdam, Netherlands.

Kanad Pala, et la., Abstract for "Evaluation of the Surface Hardness, Roughness, Gloss and Color of Composites After Different Finishing/Polishing Treatments and Thermocycling Using a Multitechnique Approach", Dental Materials Journal, Mar. 31, 2016, p. 278-289, vol. 35, No. 2, Elsevier Inc., Amsterdam, Netherlands.

Eileen O. Kutscha, et al., "Robust Bonding Through Process Control", SAMPE Proceedings, Long Beach, California, May 2018, p. 1-16.

Ryan Gory, "Damage Detection in Carbon Fiber Composites Using Electrical Resistance Measurements", The Florida State University College of Engineering, Florida State University Libraries, Electronic Theses, Treatises and Dissertations, 2012, 63 pages.

* cited by examiner

FIG. 3A

SYSTEM 90

- PCS 90a
- BOND PCS 90b
- REAL TIME PCS 90c
- IN-LINE PROC. CONTROL CHECK 92
- QUALITY 24
- COMPOSITE STRUCTURE 28
- TEST COMPOSITE STRUC. 28a
- TEST CF COMPOSITE STRUC. 28b
- COMPOSITE SURFACE 26
- TEST COMPOSITE SURFACE 26a
- CARBON FIBER (CF) COMP. SURF. 26b
- CF EPOXY COMPOSITE SURFACE 26c
- EDGE 27
- TEST COMPOSITE EDGE 27a
- REF. COMP. STRUC. 32
- REF. CF COMP. STRUC. 32a
- REF. COMP. SURF. 30
- REF. CF COMP. SURF. 30a
- COMP. SUBSTRATE 34
- COMP. PANEL 34a
- CF COMP. PANEL 34b
- CF EPOXY COMP. PANEL 34c
- COMPOSITE MATERIAL 36
- CF EPOXY COMP. MAT. 36a
- CARBON FIBERS 80
- EXPOSED CF 80a
- RESIN 82
- EPOXY RESIN 82a
- ABRADED PANEL 35
- SANDED PANEL 35a
- AIRCRAFT COMPOSITE STRUCTURE 38
- STRUCTURE 40
- AIRCRAFT STRUCTURE 40a

FIG. 3

| FIG. 3A |
|---------|
| FIG. 3B |

FIG. 3B

ABRASIVE SURFACE PREPARATION (SP) 42 | SANDING SP 42a | GRIT BLASTING SP 42b

NYLON PAD ABRASIVE SP 42c | PLASMA TREATMENT SP 42d | LASER ABLATION SP 42e

ABRASIVE SP LOC. 44 | SANDING SP LOC. 44a | ABRASIVE SP STDS. 46 | SANDING SP STDS. 46a

COMP. SURF. TREATMENT 102 | ABRADING 48 | SANDING 48a | MANUAL SANDING 48b

ABRADING DEVICE 104 | ROS 104a | ABRADED SURFACE 49 | SANDED SURFACE 49a

TEST RESULT LEVELS 58 | PLURALITY OF LEVELS 55 | LEVELS (AMT.) 56 | LEVELS (TIME) 57

SURFACE ANALYSIS TOOL 60 | PORTABLE SURFACE ANALYSIS TOOL 60a

OHM METER (OM) 66 | ELECTRICAL RESISTANCE (ER) OM 66a | SURFACE RESISTIVITY (SR) OM 66b

ER 68 | POINT-TO-POINT PROBE METHOD 76 | POINT PROBE (PP) 78 | FIRST PP 78a | SECOND PP 78b

SR 70 | WEIGHTED PROBE METHOD 84 | SR PROBE 85 | WEIGHTED SR PROBE 85a

1 SQ. IN. ALUMINUM PROBE 85b | WEIGHT 86 | 20 POUND WEIGHT 86a | 40 POUND WEIGHT 86b

CONTROLLED PRESSURE 88 | TARGET VALUE (TV) 62 | ER TV 62a | SR TV 62b

MEASUREMENTS (MEAS.) 64 | TEST RESULT MEAS. 64a | ER MEAS. 72 | SR MEAS. 74

POST-PROCESSING OPERATION 50

BONDING 52 | PASTE BONDING 52a | ADHESIVE BONDING 52b

ORGANIC FINISHING 53 | PAINTING 53a | ORGANIC FINISH 54 | PAINT 54a

METHOD AND SYSTEM FOR DETERMINING A QUALITY OF AN ABRASIVE SURFACE PREPARATION OF A COMPOSITE SURFACE USING ELECTRICAL RESISTANCE AND SURFACE RESISTIVITY

REFERENCE TO GOVERNMENT CONTRACT

This invention was made with Government support under contract number NNL09AA00A awarded by NASA. The government has certain rights in this invention.

CROSS REFERENCE TO RELATED APPLICATION

This nonprovisional patent application is related to U.S. nonprovisional patent application Ser. No. 16/274,184, titled METHOD AND SYSTEM FOR DETERMINING A QUALITY OF AN ABRASIVE SURFACE PREPARATION OF A COMPOSITE SURFACE PRIOR TO A POST-PROCESSING OPERATION, filed on Feb. 12, 2019, the contents of which are hereby incorporated by reference in its entirety.

FIELD

The disclosure relates generally to methods and systems for process control in the manufacture of composite structures, and more particularly, to methods and systems for process control of abrasive surface preparation of composite structures using electrical resistance and surface resistivity, prior to undergoing post-processing operations, such as bonding or organic finishing.

BACKGROUND

High performance applications for bonded composite structures, such as composite panels made of carbon fiber epoxy composite material or another suitable composite material, requires assurance of proper surface preparation prior to bonding. For example, proper surface preparation may include sanding of the composite surface prior to bonding, and verifying that the sanding occurred, and that the sanding was performed correctly, to avoid over sanding or under sanding of the composite surface. However, surface preparation of composites using sanding is a highly variable process and the acceptance criteria may be difficult to quantify.

Known methods and systems exist for verifying proper surface preparation of sanded surfaces. However, such known methods and systems typically rely on qualitative visual inspection of a sanded surface. Such qualitative visual inspection is typically subjective in nature and not quantitative, and may be variable from operator to operator. The subjective nature of such known visual inspection may potentially increase unnecessary reworking of parts.

Thus, it would be advantageous to have a method and a system that take into account one or more of the issues discussed above, that provide a quantitative method and system for ensuring consistent and reliable abrasive surface preparation for a composite surface, prior to the composite surface undergoing a post-processing operation, such as bonding or paint adhesion, that ensures the quality of subsequent adhesive bonding and paint adhesive, that avoid or minimize unnecessary reworking of parts due to qualitative visual inspections, and that provide advantages over known methods and systems.

SUMMARY

Example implementations of the present disclosure provide for methods and a system for determining a quality of an abrasive surface preparation of a composite surface, prior to undergoing a post-processing operation, and provide significant advantages over existing methods and systems.

In one version there is provided a method for determining a quality of an abrasive surface preparation of a composite surface, prior to the composite surface undergoing a post-processing operation. The method comprises fabricating a plurality of levels of abrasive surface preparation standards for a reference composite surface of one or more reference composite structures. The method further comprises using a surface analysis tool comprising an ohm meter, to create one or more target values for quantifying the plurality of levels of the abrasive surface preparation standards.

The method further comprises measuring, with the surface analysis tool comprising the ohm meter, one or more abrasive surface preparation locations on the composite surface of a test composite structure, to measure one or more of, electrical resistance and surface resistivity, of the composite surface, to obtain one or more test result measurements. The method further comprises comparing the one or more test result measurements to the plurality of levels of the abrasive surface preparation standards, to obtain one or more test result levels of the abrasive surface preparation of the test composite structure.

The method further comprises determining if the one or more test result levels of the abrasive surface preparation meet the one or more target values, to determine the quality of the abrasive surface preparation of the composite surface. The method further comprises determining whether the composite surface of the test composite structure is acceptable to proceed with undergoing the post-processing operation.

In another version there is provided a quantitative method for determining a quality of a sanding surface preparation of a carbon fiber composite surface, prior to bonding the carbon fiber composite surface to a structure. The quantitative method comprises fabricating a plurality of levels of sanding surface preparation standards for a reference carbon fiber composite surface of one or more reference carbon fiber composite structures. The quantitative method further comprises using a surface analysis tool comprising an ohm meter, to create one or more target values for quantifying the plurality of levels of the sanding surface preparation standards.

The quantitative method further comprises measuring, with the surface analysis tool comprising the ohm meter, one or more sanding surface preparation locations on the carbon fiber composite surface of a test carbon fiber composite structure, to measure one or more of, electrical resistance and surface resistivity, of the carbon fiber composite surface, to obtain one or more test result measurements. The quantitative method further comprises comparing the one or more test result measurements to the plurality of levels of the sanding surface preparation standards, to obtain one or more test result levels of the sanding surface preparation of the test carbon fiber composite structure.

The quantitative method further comprises determining if the one or more test result levels of the sanding surface preparation meet the one or more target values, to determine the quality of the sanding surface preparation of the carbon fiber composite surface. The quantitative method further comprises determining whether the carbon fiber composite surface of the test carbon fiber composite structure is acceptable to proceed with bonding to the structure.

In another version there is provided a system for determining a quality of an abrasive surface preparation of a composite surface, prior to the composite surface undergoing a post-processing operation. The system comprises a reference composite structure having a reference composite surface. The system further comprises a plurality of levels of abrasive surface preparation standards fabricated for the reference composite surface.

The system further comprises a test composite structure having the composite surface, and the composite surface having one or more abrasive surface preparation locations that have been abraded with an abrading device. The system further comprises a surface analysis tool comprising an ohm meter, to create one or more target values for quantifying the plurality of levels of the abrasive surface preparation standards. The surface analysis tool comprising the ohm meter is configured to measure the one or more abrasive surface preparation locations on the composite surface of the test composite structure, and to measure one or more of, electrical resistance and surface resistivity, of the composite surface, to obtain one or more test result measurements.

The one or more test result measurements is compared to the plurality of levels of the abrasive surface preparation standards, to obtain one or more test result levels of the abrasive surface preparation of the test composite structure, and to determine if the one or more test result levels meet the one or more target values, to determine the quality of the abrasive surface preparation of the composite surface, and to determine if the composite surface is acceptable to proceed with undergoing the post-processing operation.

The features, functions, and advantages that have been discussed can be achieved independently in various versions of the disclosure or may be combined in yet other versions further details of which can be seen with reference to the following description and drawings.

BRIEF DESCRIPTION OF THE DRAWINGS

The disclosure can be better understood with reference to the following detailed description taken in conjunction with the accompanying drawings which illustrate preferred and exemplary version, but which are not necessarily drawn to scale, wherein:

FIG. 3 is an illustration showing that FIG. 3 includes FIG. 3A and FIG. 3B;

FIG. 3A and FIG. 3B are illustrations of a functional block diagram showing an exemplary version of a system of the disclosure;

The figures shown in this disclosure represent various aspects of the versions presented, and only differences will be discussed in detail.

DETAILED DESCRIPTION

Disclosed versions or embodiments will now be described more fully hereinafter with reference to the accompanying drawings, in which some, but not all of the disclosed versions are shown. Indeed, several different versions may be provided and should not be construed as limited to the versions set forth herein. Rather, these versions are provided so that this disclosure will be thorough and fully convey the scope of the disclosure to those skilled in the art.

Figure 1:
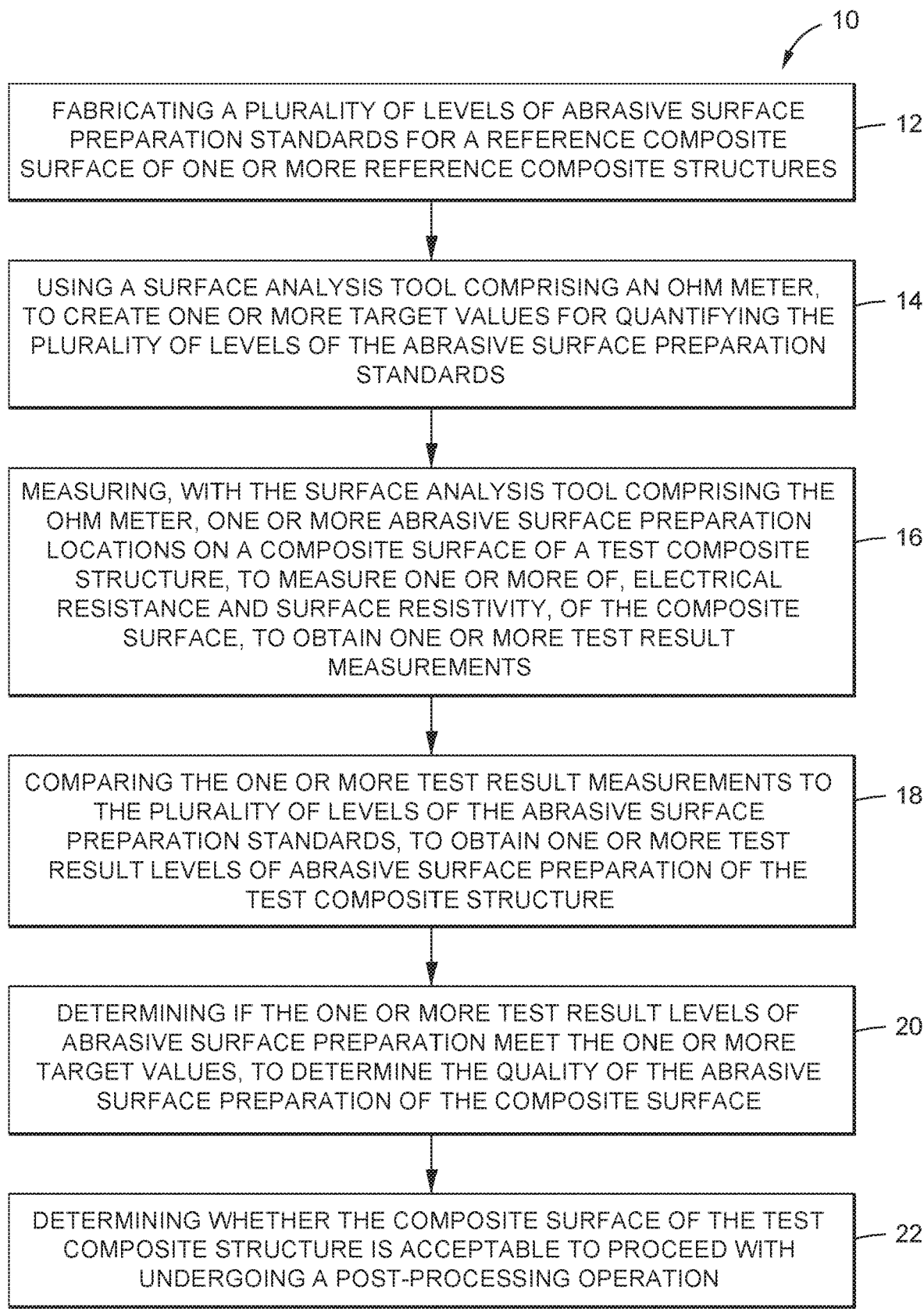
FIG. 1 is an illustration of a flowchart of steps of an exemplary version of a method of the disclosure.
Figure 2:
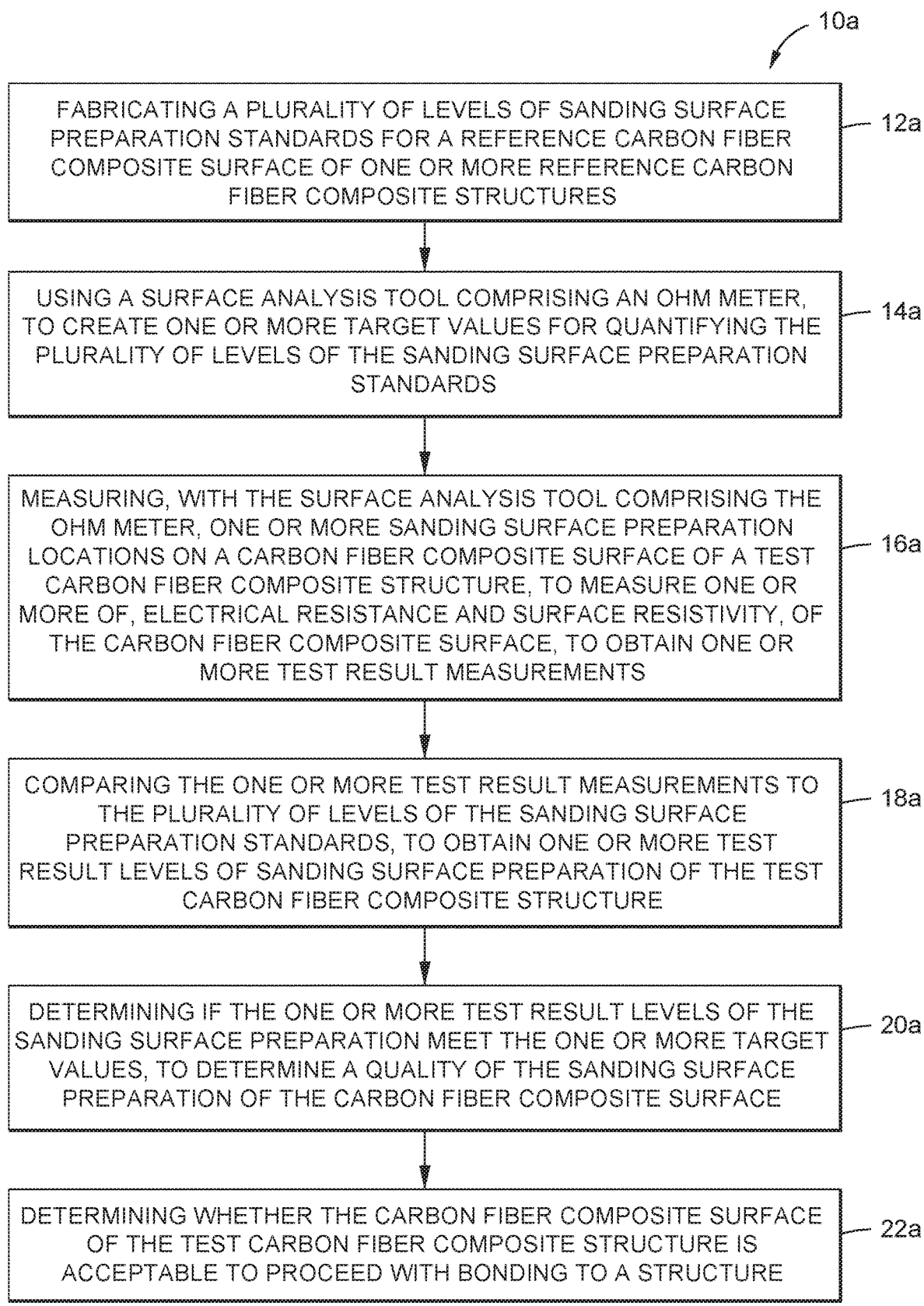
FIG. 2 is an illustration of a flowchart of steps of another exemplary version of a method of the disclosure.

Now referring to the Figures, FIG. 1 is an illustration of a flowchart of steps of an exemplary version of a method 10 of the disclosure, FIG. 2 is an illustration of a flowchart of steps of an exemplary version of a quantitative method 10a of the disclosure, and FIG. 3, including FIG. 3A and FIG. 3B portions, are illustrations of a functional block diagram showing an exemplary version of a system 90 of the disclosure.

The blocks in FIGS. 1, 2, 3, 3A and 3B represent operations and/or portions thereof, or elements, and lines connecting the various blocks do not imply any particular order or dependency of the operations or portions thereof, or elements. FIGS. 1 and 2 and the disclosure of the steps of the method 10 and the quantitative method 10*a*, respectively, set forth herein should not be interpreted as necessarily determining a sequence in which the steps are to be performed. Rather, although one illustrative order is indicated, it is to be understood that the sequence of the steps may be modified when appropriate. Accordingly, certain operations may be performed in a different order or simultaneously.

As shown in FIG. 1, in one version, there is provided the method 10 for determining a quality 24 (see FIG. 3A) of an abrasive surface preparation 42 (see FIG. 3B) of a composite surface 26 (see FIG. 3A), prior to the composite surface 26 undergoing a post-processing operation 50 (see FIG. 3B). As shown in FIG. 3B, the abrasive surface preparation 42 may comprise a sanding surface preparation (SP) 42*a*, a grit blasting surface preparation 42*b*, a nylon pad abrasive surface preparation 42*c*, a plasma treatment surface preparation 42*d*, a laser ablation surface preparation 42*e*, or another suitable abrasive surface preparation with an abrading device 104 or abrasive media tool that physically abrades the composite surface 26. With plasma treatment surface preparation 42*d*, for example, low-pressure plasma treatment surface preparation, gas is excited by energy supplied in a vacuum, which results in energetic ions and electrons, as well as other reactive particles, which constitute the plasma, and the composite surfaces may be altered by micro-sandblasting, in which the composite surface is removed by ion bombardment. With laser ablation surface preparation 42*e*, material is removed from a solid surface, such as the composite surface 26, by irradiating it with a laser beam.

As shown in FIG. 1, the method 10 comprises the step of fabricating 12 a plurality of levels 55 (see FIG. 3B) of abrasive surface preparation standards 46 (see FIG. 3B) for a reference composite surface 30 (see FIG. 3A) of one or more reference composite structures 32 (see FIG. 3A).

As shown in FIG. 1, the method 10 further comprises the step of using 14 a surface analysis tool 60 (see FIG. 3B) comprising an ohm meter 66 (see FIG. 3B), to create one or more target values 62 (see FIG. 3B) for quantifying the plurality of levels 55 of the abrasive surface preparation standards 46.

As shown in FIG. 1, the method 10 further comprises the step of measuring 16, with the surface analysis tool 60 comprising the ohm meter 66, one or more abrasive surface preparation locations 44 (see FIG. 3B) on the composite surface 26 (see FIG. 3A) of a test composite structure 28*a* (see FIG. 3A), to measure one or more of, electrical resistance 68 (see FIG. 3B) and surface resistivity 70 (see FIG. 3B), of the composite surface 26, to obtain one or more test result measurements 64*a* (see FIG. 3B).

As used here, "electrical resistance" means an electrical quantity that measures how the material or object reduces the electric current flow through it, and the electrical resistance is a measure of the material's or object's opposition to the flow of electric current, and the electrical resistance is measured in units of ohms ($\Omega$).

As used herein, "surface resistivity" means for an electric current flowing across a surface, the ratio of direct current (DC) voltage drop per unit length to the surface current per width, and the surface resistivity is the resistance between two opposite sides of a square and is independent of the size of the square or its dimensional units, and surface resistivity is expressed in ohms per square (ohm/sq).

The ohm meter 66 may also be part of a multimeter which measures resistance (e.g., electrical resistance and surface resistivity), current (measures the number of electrons passing a given point for certain amount of time), and voltage (measures the electrical potential between two points in volts) in a single instrument. The surface analysis tool 60 comprising the ohm meter 66 is preferably designed to measure one or more of electrical resistance 68 and surface resistivity 70.

The test composite structure 28*a* and the one or more reference composite structures 32 may comprise a composite substrate 34 (see FIG. 3A), such as in the form of a composite panel 34*a* (see FIG. 3A). The composite panel 34*a* may comprise a carbon fiber composite panel 34*b* (see FIG. 3A), for example, a carbon fiber epoxy composite panel 34*c* (see FIG. 3A), or another suitable type of composite panel 34*a*. The test composite structure 28*a* and the one or more reference composite structures 32 are preferably made of a composite material 36 (see FIG. 3A), for example, a carbon fiber epoxy composite material 36*a* (see FIG. 3A), or another suitable type of composite material 36. The test composite structure 28*a* and the one or more reference composite structures 32 may be fabricated or manufactured with a composite structure fabrication 94 (see FIG. 4).

The step of measuring 16 (see FIG. 1), with the surface analysis tool 60 comprising the ohm meter 66, preferably comprises measuring the one or more abrasive surface preparation locations 44 on the composite surface 26 of the test composite structure 28*a*, where the test composite structure 28*a* comprises the carbon fiber epoxy composite panel 34*c* (see FIG. 3A).

Figure 5:
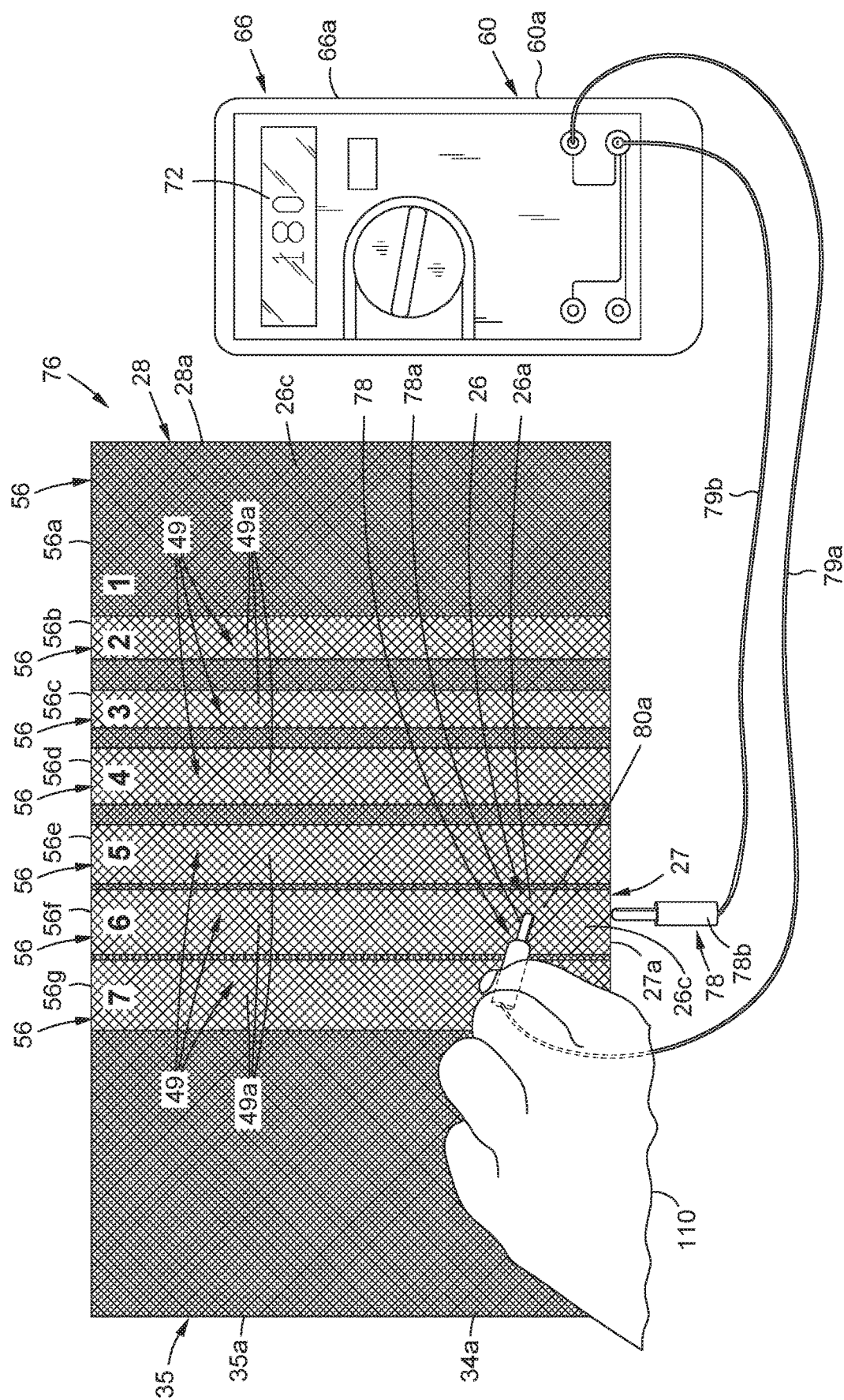
FIG. 5 is an illustration of a top view of an ohm meter in use by a user measuring electrical resistance of a composite panel using a point-to-point probe method.

The step of measuring 16 (see FIG. 1), with the surface analysis tool 60 comprising the ohm meter 66, may further comprise measuring the electrical resistance 68 (see FIG. 3B) of the composite surface 26 with the ohm meter 66 (see FIGS. 3B, 5) comprising an electrical resistance ohm meter 66*a* (see FIGS. 3B, 5). The step of measuring 16 (see FIG. 1), with the surface analysis tool 60 comprising the ohm meter 66, may further comprise, measuring the electrical resistance 68 of the composite surface 26 using a point-to-point probe method 76 (see FIG. 3B) with point probes 78 (see FIGS. 3B, 5), such as a first point probe 78*a* (see FIGS. 3B, 5) and a second point probe 78*b* (see FIGS. 3B, 5) in contact with exposed carbon fibers 80*a* (see FIG. 3A) on the composite surface 26 and on an edge 27 (see FIG. 3A), respectively, of the test composite structure 28*a*. For example, the first point probe 78*a* may be in contact with the composite surface 26, such as a test composite surface 26*a* (see FIG. 3A), of the test composite structure 28*a*, and the second point probe 78*b* may be simultaneously in contact with an edge 27 (see FIG. 3A), such as a test composite edge 27*a* (see FIG. 3A), of the test composite structure 28*a*.

Figure 7:
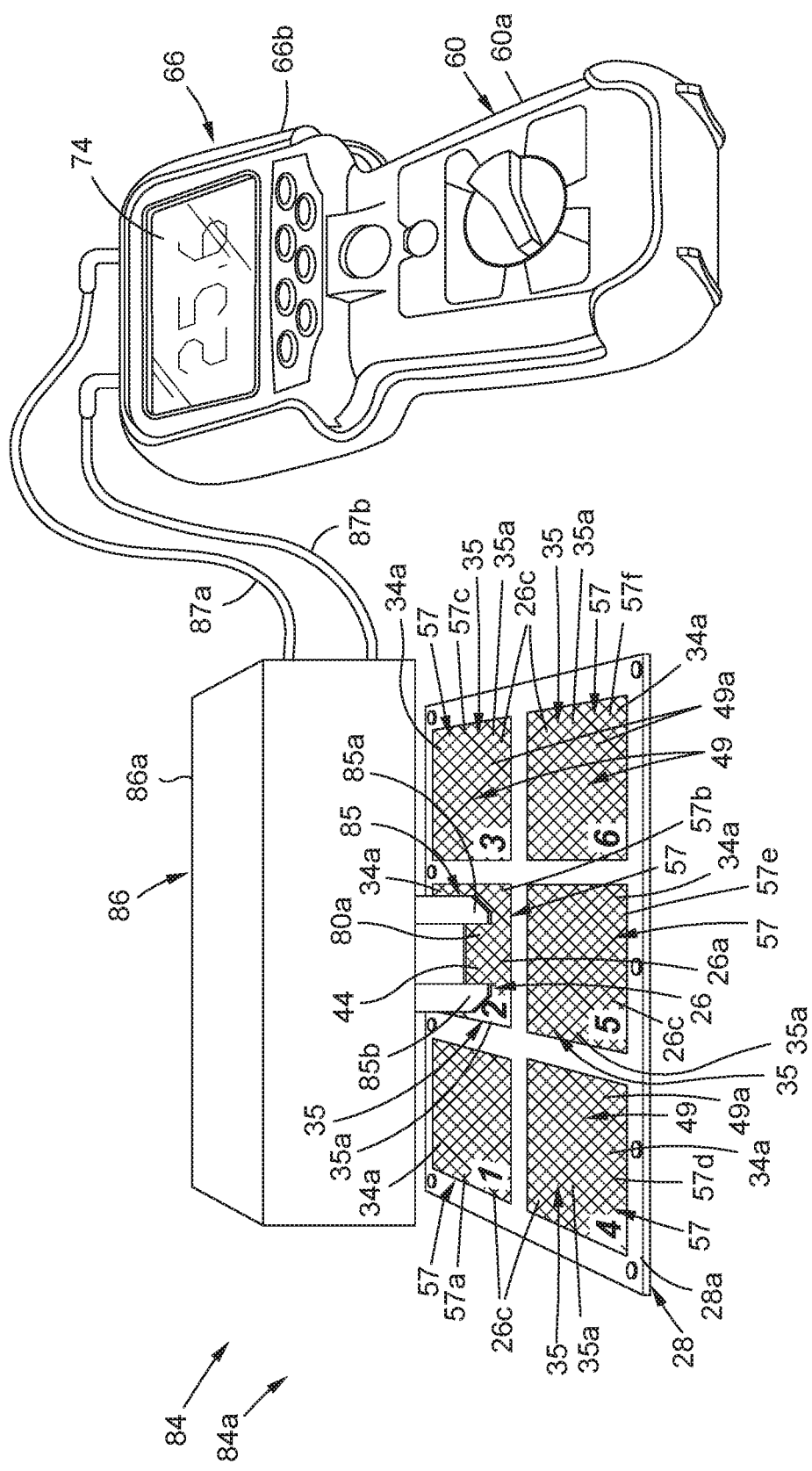
FIG. 7 is an illustration of a perspective front view of a surface resistivity ohm meter in operation to take surface resistivity measurements of composite panels using a version of a weighted probe method.
Figure 8:
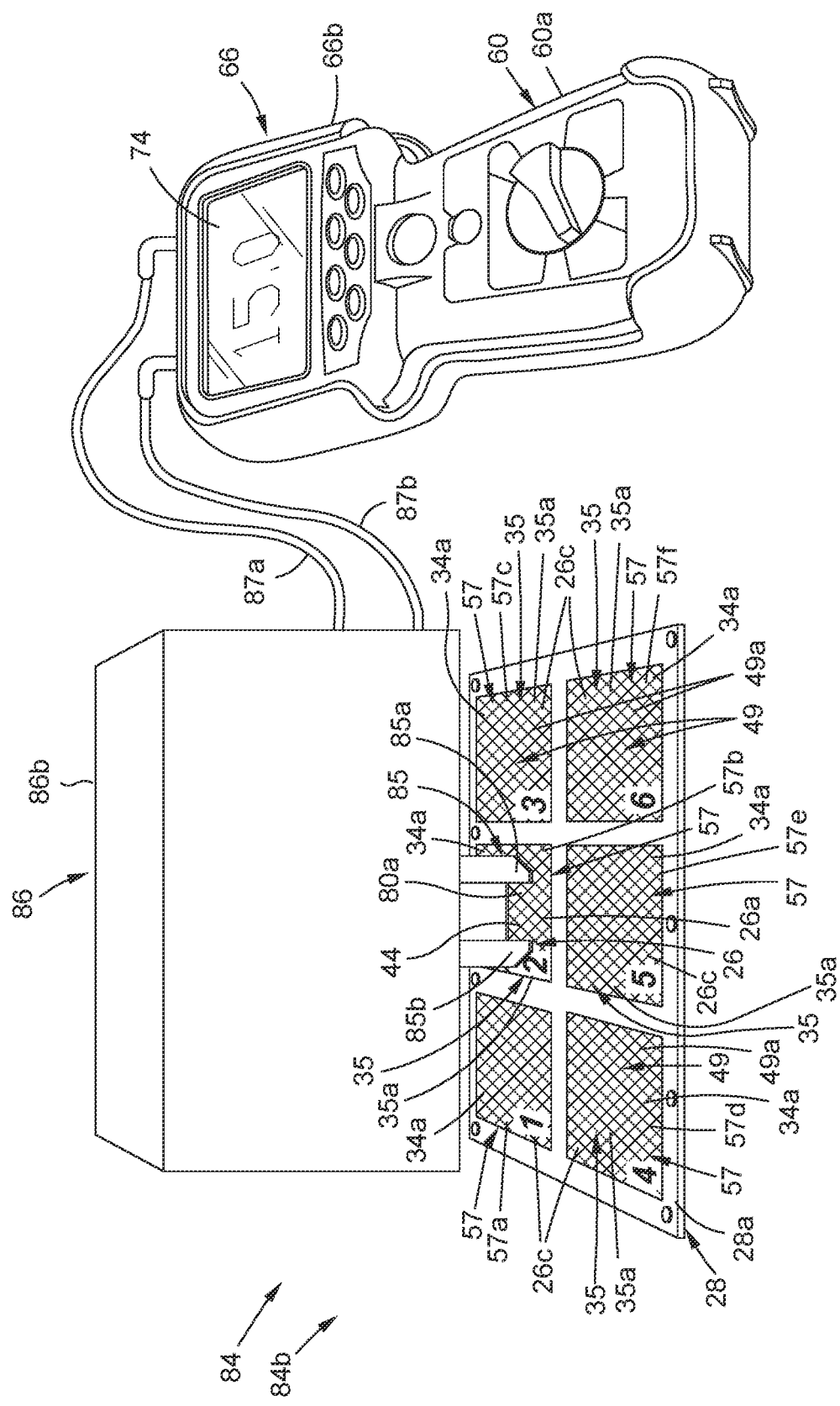
FIG. 8 is an illustration of a perspective front view of a surface resistivity ohm meter in operation to take surface resistivity measurements of composite panels using another version of a weighted probe method.

The step of measuring 16 (see FIG. 1), with the surface analysis tool 60 comprising the ohm meter 66, may further comprise, measuring the surface resistivity 70 (see FIG. 3B) of the composite surface 26 with the ohm meter 66 comprising a surface resistivity ohm meter 66*b* (see FIGS. 3B, 7, 8). The step of measuring 16 (see FIG. 1), with the surface analysis tool 60 comprising the ohm meter 66, may further comprise, measuring the surface resistivity 70 of the composite surface 26 using a weighted probe method 84 (see FIG. 3B) with a surface resistivity probe 85 (see FIG. 3B) in contact with one of the one or more abrasive surface preparation locations 44 (see FIG. 3B) on the composite surface 26, and with a weight 86 (see FIG. 3B), or weighted element, placed on the surface resistivity probe 85, to apply a controlled pressure 88 (see FIG. 3B) to the surface resistivity probe 85, during measuring. The step of measuring 16 (see FIG. 1), with the surface analysis tool 60 comprising the ohm meter 66, may further comprise, measuring the surface resistivity 70 of the composite surface 26 using the weighted probe method 84 further comprising, placing the weight 86, or weighted element, comprising a twenty pound (20 lb.) weight 86a (see FIG. 3B) on the surface resistivity probe 85, during measuring. Alternatively, the step of measuring 16 (see FIG. 1), with the surface analysis tool 60 comprising the ohm meter 66, may further comprise, measuring the surface resistivity 70 of the composite surface 26 using the weighted probe method 84 further comprising, placing the weight 86 comprising a forty pound (40 lb.) weight 86b (see FIG. 3B) on the surface resistivity probe 85, during measuring.

As shown in FIG. 1, the method 10 further comprises the step of comparing 18 the one or more test result measurements 64a (see FIG. 3B) to the plurality of levels 55 (see FIG. 3B) of the abrasive surface preparation standards 46 (see FIG. 3B), to obtain the one or more test result levels 58 (see FIG. 3B) of the abrasive surface preparation 42, of the test composite structure 28a.

As shown in FIG. 1, the method 10 further comprises the step of determining 20 if the one or more test result levels 58 of the abrasive surface preparation 42 meet the one or more target values 62, to determine the quality 24 (see FIG. 3A) of the abrasive surface preparation 42 of the composite surface 26.

Preferably, an electrical resistance target value 62a (see FIG. 3B) comprises an electrical resistance measurement 72 (see FIG. 3B) of electrical resistance 68, and preferably a surface preparation threshold limit 116 (see FIG. 6), or baseline, for the electrical resistance 68 is less than 50 (fifty) Ohms.

Preferably, a surface resistivity target value 62b (see FIG. 3B) comprises a surface resistivity measurement 74 (see FIG. 3B) of surface resistivity 70, and preferably, a surface preparation threshold limit 148 (see FIG. 11), and a surface preparation threshold limit 158 (see FIG. 12), or baseline, for the surface resistivity 70 for 1 (one) minute of abrading 48 (see FIG. 3B), such as sanding 48a (see FIG. 3B), is less than 5 (five) Ohms/sq. individual maximum. Preferably, a surface preparation threshold limit 173 (see FIG. 13), or baseline, for the surface resistivity 70 for 1 (one) minute of abrading 48, such as sanding 48a, is less than 2 (two) Ohms/sq. individual minimum. Composite surfaces 26 without or with exposed carbon fibers 80a, have a surface resistivity 70 of less than 1,000 Ohms averaged over the area of concern and the composite substrate 34 (see FIG. 3A).

As shown in FIG. 1, the method 10 further comprises the step of determining 22 whether the composite surface 26 of the test composite structure 28a is acceptable to proceed with undergoing the post-processing operation 50 (see FIG. 3B). The step of determining 22 whether the composite surface 26 of the test composite structure 28a is acceptable to proceed with undergoing the post-processing operation 50 may further comprise, determining whether the composite surface 26 is acceptable to proceed with undergoing the post-processing operation 50 comprising bonding 52 (see FIG. 3B) the composite surface 26 to a structure 40 (see FIG. 3A). The bonding 52 may include paste bonding 52a (see FIG. 3B), adhesive bonding 52b (see FIG. 3B), or another suitable type of bonding of the composite surface 26 to the structure 40. The structure 40 may comprise an aircraft structure 40a (see FIG. 3A), or another suitable structure. For example, the aircraft structure 40a may comprise a stringer such as a blade stringer, a vent stringer, or another suitable stringer, or a rib, or another suitable aircraft structure.

Alternatively, the step of determining 22 whether the composite surface 26 of the test composite structure 28a is acceptable to proceed with undergoing the post-processing operation 50 may further comprise, determining whether the composite surface 26 is acceptable to proceed with undergoing the post-processing operation 50 comprising applying an organic finish 54 (see FIG. 3B) to the composite surface 26 of the structure 40, for example, organic finishing 53 (see FIG. 3B) the composite surface 26 with an organic finish 54 (see FIG. 3B). The organic finishing 53 may include painting 53a (see FIG. 3B), or another suitable type of organic finishing of the composite surface 26 of the structure 40. The organic finish 54 may comprise a paint 54a (see FIG. 3B), or another suitable organic finish.

In another version, as shown in FIG. 2, there is provided the quantitative method 10a for determining a quality 24 (see FIG. 3A) of a sanding surface preparation 42a (see FIG. 3B) of a carbon fiber composite surface 26b (see FIG. 3A), prior to bonding 52 (see FIG. 3B) the carbon fiber composite surface 26b to a structure 40 (see FIG. 3A), such as an aircraft structure 40a (see FIG. 3A).

As shown in FIG. 2, the quantitative method 10a comprises the step of fabricating 12a a plurality of levels 55 (see FIG. 3B) of sanding surface preparation standards 46a (see FIG. 3B) for a reference carbon fiber composite surface 30a (see FIG. 3A) of one or more reference carbon fiber composite structures 32a (see FIG. 3A).

As shown in FIG. 2, the quantitative method 10a further comprises the step of using 14a a surface analysis tool 60 (see FIG. 3B) comprising an ohm meter 66 (see FIG. 3B), to create one or more target values 62 (see FIG. 3B) for quantifying the plurality of levels 55 (see FIG. 3B) of the sanding surface preparation standards 46a (see FIG. 3B).

As shown in FIG. 2, the quantitative method 10a further comprises the step of measuring 16a, with the surface analysis tool 60 comprising the ohm meter 66, one or more sanding surface preparation locations 44a (see FIG. 3B) on the carbon fiber composite surface 26b (see FIG. 3A) of a test carbon fiber composite structure 28b (see FIG. 3A), to measure one or more of, electrical resistance 68 (see FIG. 3B) and surface resistivity 70 (see FIG. 3B), of the composite surface 26, to obtain one or more test result measurements 64a (see FIG. 3B).

The step of measuring 16a (see FIG. 2), with the surface analysis tool 60 comprising the ohm meter 66, preferably comprises measuring the one or more sanding surface preparation locations 44a on the carbon fiber composite surface 26b of the test composite structure 28a, where the test composite structure 28a comprises a carbon fiber epoxy composite panel 34c (see FIG. 3A).

The step of measuring 16a (see FIG. 2), with the surface analysis tool 60 comprising the ohm meter 66, may further comprise measuring the electrical resistance 68 (see FIG. 3B) of the carbon fiber composite surface 26b with the ohm meter 66 (see FIGS. 3B, 5) comprising an electrical resistance ohm meter 66a (see FIGS. 3B, 5). The step of measuring 16a (see FIG. 2), with the surface analysis tool 60 comprising the ohm meter 66, may further comprise, measuring the electrical resistance 68 of the carbon fiber composite surface 26b using the point-to-point probe method 76 (see FIG. 3B) with point probes 78 (see FIGS. 3B, 5), such as the first point probe 78*a* (see FIGS. 3B, 5) and the second point probe 78*b* (see FIGS. 3B, 5) in contact with exposed carbon fibers 80*a* (see FIG. 3A) on the carbon fiber composite surface 26*b* and on an edge 27 (see FIG. 3A), respectively, of the test composite structure 28*a*. For example, the first point probe 78*a* may be in contact with the carbon fiber composite surface 26*b*, such as a test composite surface 26*a* (see FIG. 3A), of the test composite structure 28*a*, and the second point probe 78*b* may be simultaneously in contact with an edge 27 (see FIG. 3A), such as a test composite edge 27*a* (see FIG. 3A), of the test composite structure 28*a*.

The step of measuring 16*a* (see FIG. 1), with the surface analysis tool 60 comprising the ohm meter 66, may further comprise, measuring the surface resistivity 70 (see FIG. 3B) of the carbon fiber composite surface 26*b* with the ohm meter 66 comprising a surface resistivity ohm meter 66*b* (see FIGS. 3B, 7, 8). The step of measuring 16*a* (see FIG. 1), with the surface analysis tool 60 comprising the ohm meter 66, may further comprise, measuring the surface resistivity 70 of the carbon fiber composite surface 26*b* using a weighted probe method 84 (see FIG. 3B) with a surface resistivity probe 85 (see FIG. 3B) in contact with one of the one or more sanding surface preparation locations 44*a* on the carbon fiber composite surface 26*b*, and with a weight 86 (see FIG. 3B), or weighed element, placed on the surface resistivity probe 85, to apply a controlled pressure 88 (see FIG. 3B) to the surface resistivity probe 85, during measuring. The step of measuring 16*a* (see FIG. 1), with the surface analysis tool 60 comprising the ohm meter 66, may further comprise, measuring the surface resistivity 70 of the carbon fiber composite surface 26*b* using the weighted probe method 84 further comprising, placing the weight 86 comprising a twenty pound (20 lb.) weight 86*a* (see FIG. 3B) on the surface resistivity probe 85, during measuring. Alternatively, the step of measuring 16*a* (see FIG. 1), with the surface analysis tool 60 comprising the ohm meter 66, may further comprise, measuring the surface resistivity 70 of the carbon fiber composite surface 26*b* using the weighted probe method 84 further comprising, placing the weight 86 comprising a forty pound (40 lb.) weight 86*b* (see FIG. 3B) on the surface resistivity probe 85, during measuring.

As discussed above, preferably, an electrical resistance target value 62*a* (see FIG. 3B) comprises an electrical resistance measurement 72 (see FIG. 3B) of electrical resistance 68, and preferably a surface preparation threshold limit 116 (see FIG. 6), or baseline, for the electrical resistance 68 is less than 50 (fifty) Ohms.

Preferably, a surface resistivity target value 62*b* (see FIG. 3B) comprises a surface resistivity measurement 74 (see FIG. 3B) of surface resistivity 70, and preferably, a surface preparation threshold limit 148 (see FIG. 11), and a surface preparation threshold limit 158 (see FIG. 12), or baseline, for the surface resistivity 70 for 1 (one) minute of abrading 48 (see FIG. 3B), such as sanding 48*a* (see FIG. 3B), is less than 5 (five) Ohms/sq. (Ohms/square) individual maximum. Preferably, a surface preparation threshold limit 173 (see FIG. 13), or baseline, for the surface resistivity 70 for 1 (one) minute of abrading 48, such as sanding 48*a*, is less than 2 (two) Ohms/sq. individual minimum. Composite surfaces 26 without or with exposed carbon fibers 80*a*, have a surface resistivity 70 of less than 1,000 Ohms averaged over the area of concern and the composite substrate 34 (see FIG. 3A).

As shown in FIG. 2, the quantitative method 10*a* further comprises the step of comparing 18*a* the one or more test result measurements 64*a* (see FIG. 3B) to the plurality of levels 55 (see FIG. 3B) of the sanding surface preparation standards 46*a*, to obtain one or more test result levels 58 (see FIG. 3B) of the sanding surface preparation 42*a* (see FIG. 3B) of the test carbon fiber composite structure 28*b*.

As shown in FIG. 2, the quantitative method 10*a* further comprises the step of determining 20*a* if the one or more test result levels 58 of the sanding surface preparation 42*a* meet the one or more target values 62, to determine the quality 24 (see FIG. 3A) of the sanding surface preparation 42*a* of the carbon fiber composite surface 26*b* (see FIG. 3A).

As shown in FIG. 2, the quantitative method 10*a* further comprises the step of determining 22*a* whether the carbon fiber composite surface 26*b* of the test carbon fiber composite structure 28*b* is acceptable to proceed with bonding 52 (see FIG. 3B) to the structure 40 (see FIG. 3A). The bonding 52 may include paste bonding 52*a* (see FIG. 3B), adhesive bonding 52*b* (see FIG. 3B), or another suitable type of bonding, of the composite surface 26 to the structure 40. The structure 40 may comprise an aircraft structure 40*a* (see FIG. 3A), or another suitable structure 40.

FIGS. 3A and 3B of FIG. 3 show an exemplary version of the system 90 of the disclosure. In another version, there is provided the system 90 (see FIGS. 3A, 3B) for determining the quality 24 (see FIG. 3A) of the abrasive surface preparation 42 (see FIG. 3B), such as the sanding surface preparation 42*a* (see FIG. 3B), of the composite surface 26 (see FIG. 3A), prior to the composite surface 26 undergoing the post-processing operation 50 (see FIG. 3B). As discussed above and shown in FIG. 3B, the abrasive surface preparation 42 may comprise a sanding surface preparation (SP) 42*a*, a grit blasting surface preparation 42*b*, a nylon pad abrasive surface preparation 42*c*, a plasma treatment surface preparation 42*d*, a laser ablation surface preparation 42*e*, or another suitable abrasive surface preparation with an abrading device 104 (see FIG. 3B) or abrasive media tool that physically abrades the composite surface 26.

The post-processing operation 50 (see FIG. 3B) may comprise bonding 52 (see FIG. 3B) to a structure 40 (see FIG. 3A), such as an aircraft structure 40*a* (see FIG. 3A). As shown in FIG. 3B, the bonding 52 may comprise paste bonding 52*a*, adhesive bonding 52*b*, or another suitable type of bonding. As further shown in FIG. 3B, the post-processing operation 50 may comprise applying an organic finish 54 to the composite surface 26 of the structure 40, for example, organic finishing 53 the composite surface 26 with the organic finish 54. The organic finishing 53 may include painting 53*a* (see FIG. 3B), or another suitable type of organic finishing of the composite surface 26 of the structure 40. The organic finish 54 may comprise a paint 54*a* (see FIG. 3B), or another suitable organic finish.

As shown in FIG. 3A, the system 90 preferably comprises a process control system (PCS) 90*a*, such as a bond process control system (PCS) 90*b*. As further shown in FIG. 3A, the system 90 is preferably a real time (RT) process control system (PCS) 90*c*, and preferably the system 90 is automated for bond process control. As further shown in FIG. 3A, the system 90 is preferably used in an in-line process control check 92, or monitoring.

As further shown in FIG. 3A, the system 90 comprises a composite structure 28, such as a test composite structure 28*a*, for example, a test carbon fiber composite structure 28*b*. The composite structure 28, such as the test composite structure 28*a*, has the composite surface 26 (see FIG. 3A), such as a test composite surface 26*a* (see FIG. 3A). The composite surface 26, such as the test composite surface 26*a*, may comprise a carbon fiber (CF) composite surface 26*b* (see FIG. 3A), such as a carbon fiber (CF) epoxy composite surface 26*c* (see FIG. 3A), or another suitable type of composite surface. As shown in FIG. 3A, the composite structure 28, such as the test composite structure 28a, further has one or more edges 27, such as one or more test composite edges 27a.

As further shown in FIG. 3A, the system 90 comprises a reference composite structure 32, such as a reference carbon fiber composite structure 32a, having a reference composite surface 30, such as a reference carbon fiber composite surface 30a.

The composite structure 28, such as the test composite structure 28a, and the reference composite structure 32 may comprise a composite substrate 34 (see FIG. 3A), such as in the form of a composite panel 34a (see FIG. 3A). The composite panel 34a preferably comprises a carbon fiber (CF) composite panel 34b (see FIG. 3A), for example, a carbon fiber (CF) epoxy composite panel 34c (see FIG. 3A), or another suitable type of composite panel. The composite structure 28, such as the test composite structure 28a, and the reference composite structure 32 may comprise an aircraft composite structure 38 (see FIG. 3A), or another suitable type of composite structure, that may be bonded, or organic finished or painted. Further, the composite structure 28, such as the test composite structure 28a, and the reference composite structure 32 are preferably made of a composite material 36 (see FIG. 3A), for example, a carbon fiber (CF) epoxy composite material 36a (see FIG. 3A), or another suitable type of composite material 36.

As shown in FIG. 3A, the composite material 36 preferably comprises carbon fibers 80 embedded in resin 82, such as epoxy resin 82a. When the composite structure 28, such as the composite panel 34a, is abraded, such as with sanding, the abraded panel 35 (see FIG. 3A), such as the sanded panel 35a (see FIG. 3A), exposes the carbon fibers 80 embedded in the resin 82, to obtain exposed carbon fibers 80a (see FIG. 3A). The composite structure 28, such as the test composite structure 28a, and the reference composite structure 32 may be fabricated or manufactured with a composite structure fabrication 94 (see FIG. 4).

Figure 6:
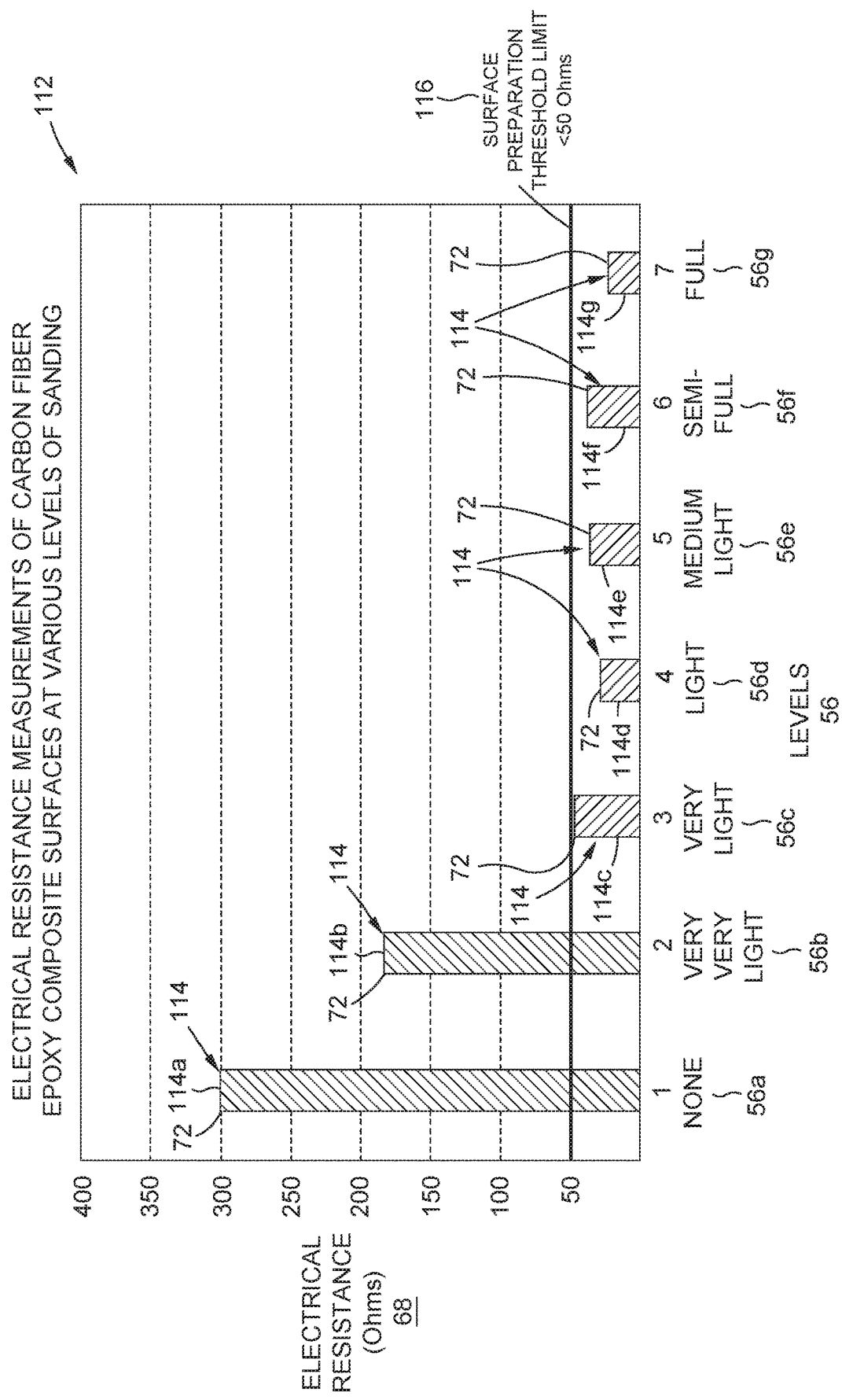
FIG. 6 is an illustration of a graph showing electrical resistance measurements of carbon fiber epoxy composite surfaces at various levels of sanding, where a point-to-point probe method was used.

The system 90 further comprises a plurality of levels 55 (see FIG. 3B) of abrasive surface preparation standards 46 (see FIG. 3B), such as sanding surface preparation standards 46a (see FIG. 3B), fabricated for the reference composite surface 30 (see FIG. 3A). For assessment of the electrical resistance 68 (see FIG. 3B) using the surface analysis tool 60 (see FIG. 3B) comprising the ohm meter 66 (see FIG. 3B), the plurality of levels 55 preferably comprise levels 56 (see FIG. 3B) of an amount of abrading 48 (see FIG. 3B), such as sanding 48a (see FIG. 3B). As shown in FIG. 6, and discussed in further detail below, the levels 56 of the amount of abrading 48, such as sanding 48a, include: 1-NONE (no sanding) 56a, 2-VERY VERY LIGHT 56b, 3-VERY LIGHT 56c, 4-LIGHT 56d, 5-MEDIUM LIGHT 56e, 6-SEMI-FULL 56f, and 7-FULL 56g.

For assessment of the surface resistivity 70 (see FIG. 3B) using the surface analysis tool 60 comprising the ohm meter 66, such as the surface resistivity ohm meter 66b (see FIG. 3B), the plurality of levels 55 preferably comprise levels 57 (see FIG. 3B) of a time of abrading 48 (see FIG. 3B), such as sanding 48a (see FIG. 3B). As shown in FIGS. 9-13, and as discussed in further detail below, the levels 57 of the time of abrading 48, such as sanding 48a, include: 1—0 SEC (zero second) (no sanding) 57a, 2—5 SEC (five seconds) 57b, 3—10 SEC (ten seconds) 57c, 4—30 SEC (thirty seconds) 57d, 5—1 MIN (one minute) 57e, and 6—2 MIN (two minutes) 57f.

The composite surface 26 of the test composite structure 28a and the reference composite surface 30 of the reference composite structure 32 may both undergo a composite surface treatment 102 (see FIG. 3B), such as the abrasive surface preparation 42, for example, sanding surface preparation 42a, using an abrading device 104 (see FIG. 3B), such as a random orbital sander (ROS) 104a (see FIG. 3B), or another suitable abrading device, to obtain an abraded surface 49 (see FIG. 3B), such as a sanded surface 49a (see FIG. 3B). The composite surface 26 has one or more abrasive surface preparation locations 44 (see FIG. 3B), such as sanding surface preparation locations 44a (see FIG. 3B), that have undergone abrading 48 (see FIG. 3B), such as sanding 48a (see FIG. 3B), for example, manual sanding 48b (see FIG. 3B), with the abrading device 104, such as the random orbital sander (ROS) 104a, or another suitable abrading device.

Figure 4:
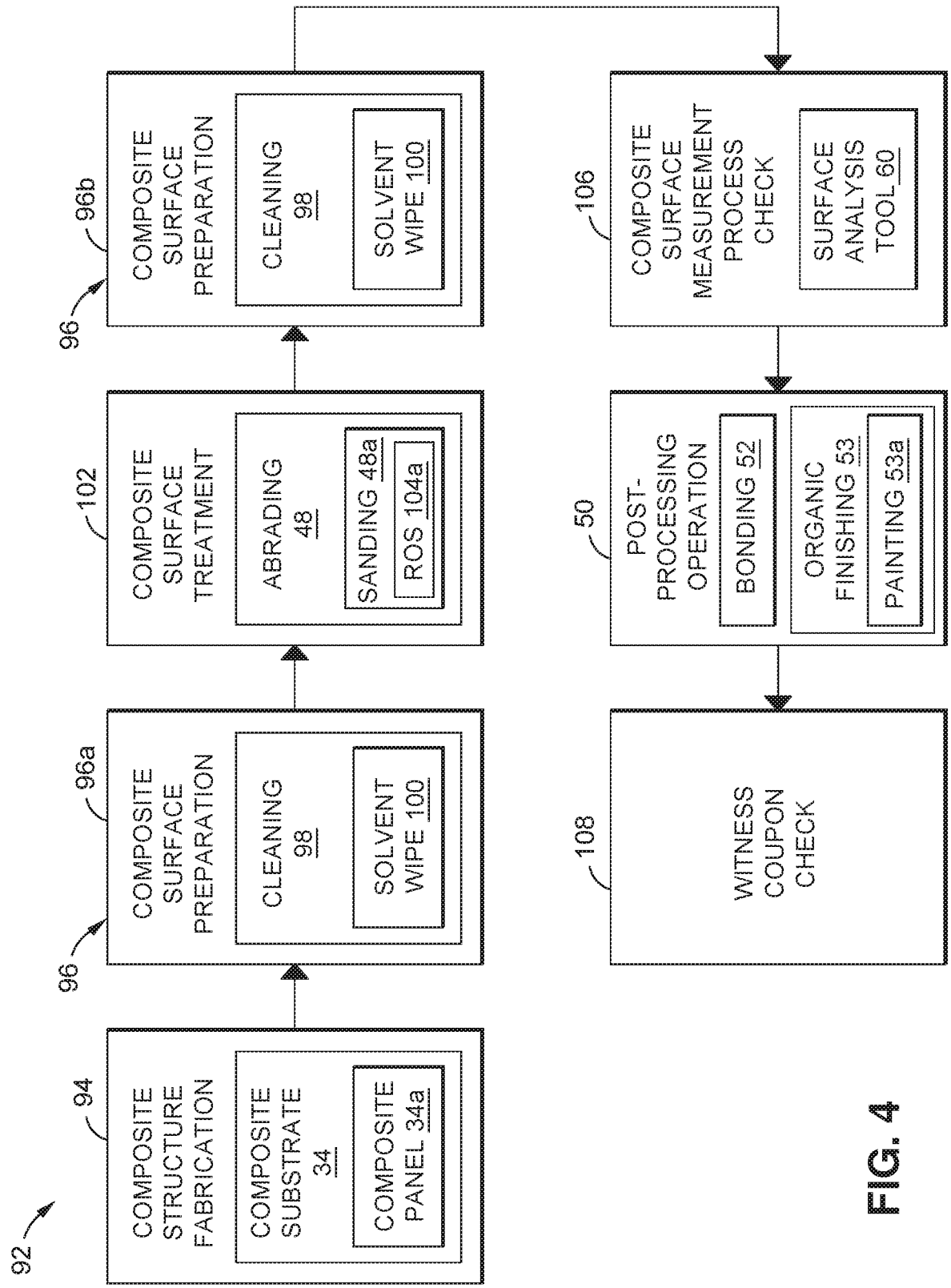
FIG. 4 is an illustration of an exemplary version of an in-line process control check of the disclosure.

As shown in FIG. 3B, the system 90 further comprises the surface analysis tool 60, such as portable surface analysis tool 60a, that is used for a composite surface measurement process check 106 (see FIG. 4). As shown in FIG. 3B, the surface analysis tool 60 comprises an ohm meter 66. The ohm meter 66 may comprise an electrical resistance (ER) ohm meter 66a (see FIG. 3B), a surface resistivity (SR) ohm meter 66b (see FIG. 3B), or another suitable ohm meter.

The surface analysis tool 60 comprising the ohm meter 66, for example, the electrical resistance ohm meter 66a, measures the electrical resistance 68 of the composite surface 26 using the point-to-point probe method 76 (see FIG. 3B) with point probes 78 (see FIG. 3B) comprising a first point probe 78a (see FIG. 3B) and a second point probe 78b (see FIG. 3B), in contact with exposed carbon fibers 80a (see FIG. 3A) on a composite surface 26 (see FIG. 3A) and on an edge 27 (see FIG. 3A), respectively, of the test composite structure 28a (see FIG. 3A).

The surface analysis tool 60 comprising the ohm meter 66, for example, the surface resistivity ohm meter 66b, measures the surface resistivity 70 of the composite surface 26 using the weighted probe method 84 with a surface resistivity probe 85 (see FIG. 3B), such as a weighted surface resistivity probe 85a (see FIG. 3B), in contact with one of the one or more abrasive surface preparation locations 44 on the composite surface 26, and with a weight 86 (see FIG. 3B) placed on the surface resistivity probe 85, to apply a controlled pressure 88 (see FIG. 3B) to the surface resistivity probe 85, during measuring. In one version, the weight 86 placed on the surface resistivity probe 85 during measurement of the surface resistivity 70 comprises a twenty pound (20 lb.) weight 86a (see FIG. 3B). In another version, the weight 86 placed on the surface resistivity probe 85 during measurement of the surface resistivity 70 comprises a forty pound (40 lb.) weight 86b (see FIG. 3B), or alternatively, two (2) twenty pound (20 lb.) weights 86a. The surface resistivity probe 85 may comprise a one square inch (1 sq. in.) aluminum probe 85b (see FIG. 3B).

The surface analysis tool 60 comprising the ohm meter 66 is used to create one or more target values 62 (see FIG. 3B) for quantifying the plurality of levels 55 of the abrasive surface preparation standards 46 (see FIG. 3B). The surface analysis tool 60 comprising the ohm meter 66 is configured to measure the one or more abrasive surface preparation locations 44 on the composite surface 26 of the test composite structure 28a, and to measure one or more of, electrical resistance 68 and surface resistivity 70, to obtain one or more measurements 64 (see FIG. 3B), such as one or more test result measurements 64a (see FIG. 3B).

Preferably, the ohm meter 66, such as the electrical resistance ohm meter 66a measures one or more electrical resistance measurements 72 of electrical resistance 68. As discussed above, preferably, an electrical resistance target value 62a (see FIG. 3B) comprises an electrical resistance measurement 72 (see FIG. 3B) of electrical resistance 68, and preferably a surface preparation threshold limit 116 (see FIG. 6), or baseline, for the electrical resistance 68 is less than 50 (fifty) Ohms.

Preferably, the ohm meter 66, such as the surface resistivity ohm meter 66b measures one or more surface resistivity measurements 74 of surface resistivity 70. Preferably, a surface resistivity target value 62b (see FIG. 3B) comprises a surface resistivity measurement 74 (see FIG. 3B) of surface resistivity 70, and preferably, a surface preparation threshold limit 148 (see FIG. 11), and a surface preparation threshold limit 158 (see FIG. 12), or baseline, for the surface resistivity 70 for 1 (one) minute of abrading 48 (see FIG. 3B), such as sanding 48a (see FIG. 3B), is less than 5 (five) Ohms/sq. individual maximum. Preferably, a surface preparation threshold limit 173 (see FIG. 13), or baseline, for the surface resistivity 70 for 1 (one) minute of abrading 48, such as sanding 48a, is less than 2 (two) Ohms/sq. individual minimum. Composite surfaces 26 without or with exposed carbon fibers 80a, have a surface resistivity 70 of less than 1,000 Ohms averaged over the area of concern and the composite substrate 34 (see FIG. 3A).

The one or more measurements 64, such as the one or more test result measurements 64a, is/are compared to the plurality of levels 55 of the abrasive surface preparation standards 46, to obtain one or more test result levels 58 (see FIG. 3B) of the abrasive surface preparation 42 of the composite structure 28, such as the test composite structure 28a, and to determine if the one or more test result levels 58 meet the one or more target values 62, to determine the quality 24 (see FIG. 3A) of the abrasive surface preparation 42 of the composite surface 26, and to determine if the composite surface 26 is acceptable to proceed with undergoing the post-processing operation 50 (see FIG. 3B).

Now referring to FIG. 4, FIG. 4 is an illustration of an exemplary version of the in-line process control check 92 (see also FIG. 3A) of the disclosure. As shown in FIG. 4, the exemplary in-line process control check 92 comprises the composite structure fabrication 94 of the composite substrate 34, such as in the form of the composite panel 34a, for example, a carbon fiber epoxy composite panel 34c (see FIG. 3A). However, the composite substrate 34 may be fabricated with any suitable composite material 36 (see FIG. 3A).

As shown in FIG. 4, the exemplary in-line process control check 92 further comprises a composite surface preparation 96, such as a first composite surface preparation 96a, of the composite surface 26 (see FIG. 3A) of the composite substrate 34, such as the composite panel 34a. The composite surface preparation 96, such as the first composite surface preparation 96a, may comprise cleaning 98 (see FIG. 4), such as a solvent wipe 100 (see FIG. 4), of the composite surface 26. The cleaning 98 may be performed using a cloth or other suitable cleaning material. The solvent wipe 100 may include wiping with a solvent such as a methyl propyl ketone/methyl isobutyl ketone mixture, or another suitable solvent or solvent mixture.

As shown in FIG. 4, after the composite surface 26 is initially cleaned, the exemplary in-line process control check 92 further comprises a composite surface treatment 102 of the composite surface 26 (see FIG. 3A) of the composite substrate 34, such as the composite panel 34a. The composite surface treatment 102 preferably comprises abrading 48 (see FIG. 4), such as sanding 48a (see FIG. 4), with an abrading device 104 (see FIG. 3B), such as a random orbital sander (ROS) 104a (see FIG. 3B). Preferably, manual sanding 48b (see FIG. 3B) of the composite surface 26 is performed. Several parameters may control the level 55 (see FIG. 3B) of abrading 48, such as sanding 48a, including pressure, disk speed (revolutions per minute (RPM)), number of passes, and overall time of abrading 48, such as sanding 48a. The abrading device 104, such as the random orbital sander (ROS) 104a may use 180 grit aluminum oxide sand paper disks, or another suitable type of sanding material. Besides a sanding surface preparation (SP) 42a (see FIG. 3B), the abrading 48 may also comprise a grit blasting surface preparation 42b (see FIG. 3B), a nylon pad abrasive surface preparation 42c (see FIG. 3B), a plasma treatment surface preparation 42d (see FIG. 3B), a laser ablation surface preparation 42e (see FIG. 3B), or another suitable abrasive surface preparation, with an abrading device 104 (see FIG. 3B), or abrasive media tool, that physically abrades the composite surface 26 (see FIG. 3A).

As shown in FIG. 4, after the composite surface 26 undergoes the composite surface treatment 102, the exemplary in-line process control check 92 may further optionally comprise another composite surface preparation 96, such as a second composite surface preparation 96b, as needed, of the composite surface 26 (see FIG. 3A), that has been abraded or sanded. The composite surface preparation 96, such as the second composite surface preparation 96b, may comprise cleaning 98 (see FIG. 4), such as the solvent wipe 100 (see FIG. 4), of the composite surface 26 that has been abraded or sanded. As discussed above, the cleaning 98 may be performed using a cloth or other suitable cleaning material. The solvent wipe 100 may include wiping with a solvent such as a methyl propyl ketone/methyl isobutyl ketone mixture, or another suitable solvent or solvent mixture.

As shown in FIG. 4, after the composite surface 26, that has been abraded, such as by sanding or another suitable abrasive surface preparation, the composite surface 26 optionally undergoes the composite surface preparation 96, such as the second composite surface preparation 96b, the exemplary in-line process control check 92 further comprises composite surface measurement process check 106 using the surface analysis tool 60 comprising the ohm meter 66. As discussed above, the surface analysis tool 60 may comprise the electrical resistance ohm meter 66a (see FIG. 3B), the surface resistivity ohm meter 66b (see FIG. 3B), or another suitable ohm meter. The surface analysis tool 60 comprising the ohm meter 66, is used to take measurements 64 (see FIG. 3B), such as test result measurements 64a (see FIG. 3B), of one or more abrasive surface preparation locations 44 (see FIG. 3B), such as one or more sanding surface preparation locations 44a (see FIG. 3B), of the composite surface 26 (see FIG. 3A) of the test composite structure 28a (see FIG. 3A).

As shown in FIG. 4, after the composite surface 26, that has been abraded or sanded, undergoes the composite surface measurement process check 106 using the surface analysis tool 60, the exemplary in-line process control check 92 further comprises the post-processing operation 50, such as bonding 52, organic finishing 53 including painting 53a, or another suitable post-processing operation 50, if it is determined that the composite surface 26 of the test composite structure 28a is acceptable to proceed with undergoing the post-processing operation 50. For example, the composite surface 26, if acceptable for bonding 52, may be bonded to a structure 40 (see FIG. 3A), such as an aircraft structure 40a (see FIG. 3A).

As shown in FIG. 4, after the composite surface 26, that has been acceptably abraded or sanded, undergoes the post-processing operation 50, the exemplary in-line process control check 92 further comprises a witness coupon check 108 of the composite surface 26 of the test composite structure 28a bonded to the structure 40 (see FIG. 3A), such as the aircraft structure 40a (see FIG. 3A), to verify that the bonded joint is acceptable and meets certification requirements.

EXAMPLES

The surface analysis tool 60 comprising the ohm meter 66 was evaluated for its ability to quantitatively measure and assess the presence and level of abrasive surface preparation 42 (see FIG. 3B), such as sanding surface preparation 42a (see FIG. 3B). The surface analysis tool 60 comprising the ohm meter 66 was selected based on its potential to detect variations in the abrasive surface preparation output, the tool's rapid measurement capabilities, and the ability of the output to be used as a "go/no go" check in a real time process control system 90c (see FIG. 3A). The goal was for the surface analysis tool 60 to be utilized as an in-line process control check tool to verify if a bonding process step had occurred, and if it had been performed correctly.

In addition to analytical measurement, process parameters such as sanding time, pressure, and equipment settings were also evaluated. Both the surface analysis tool results and the process parameter variables were intended to be integrated into the process control system 90a (see FIG. 3A) discussed above, or an enhanced bonding workstation discussed below. A more tightly controlled process control system 90a narrows the limits in which an operation may take place and improves the reliability of the bonding process, resulting in a more robust bonded joint. An additional benefit of the in-line process control check 92 (see FIGS. 3A, 4) having video monitoring is a digital thread enabling downstream troubleshooting should an issue arise in the field on a specific bonded part.

Composite Structure Fabrication

Composite structures 28 (see FIG. 3A), such as composite substrates 34 (see FIGS. 3A, 4), in the form of composite panels 34a (see FIGS. 3A, 4), were made of carbon fiber epoxy composite fabric. The composite panels were fabricated using 10 (ten) plies of 177° C. (350° F.) cure carbon fiber epoxy prepreg.

Composite Surface Preparation

The composite surface of each composite panel was solvent wiped prior to, and after, sanding, with an EASTMAN methyl isobutyl ketone (MIBK)/methyl propyl ketone (MPK) solvent mixture. (EASTMAN is a registered trademark owned by Eastman Chemical Company of Kingsport, Tenn.)

Composite Surface Treatment

Each composite panel was surface treated by using varied process parameters associated with manually sanding with a random orbital sander (ROS) and 180 grit aluminum oxide sand paper disks. Amount of sanding and time of sanding were used as processing variables. For assessment of the surface analysis tool 60 comprising the ohm meter 66, for example, the electrical resistance ohm meter 66a (see FIG. 3B), to test for electrical resistance 68 (see FIG. 3B), different panels with various levels 56 of the amount of abrading 48 (see FIG. 3B), such as sanding 48a (see FIG. 3B), were used, including the levels 56 (see FIG. 3B) of the amount of sanding 48a of: 1-NONE (no sanding) 56a, 2-VERY VERY LIGHT 56b, 3-VERY LIGHT 56c, 4-LIGHT 56d, 5-MEDIUM LIGHT 56e, 6-SEMI-FULL 56f, and 7-FULL 56g. A surface preparation threshold limit 116 (see FIG. 6) of less than 50 (fifty) Ohms was the baseline.

For assessment of the surface analysis tool 60 comprising the ohm meter 66, for example, the surface resistivity ohm meter 66b (see FIG. 3B), to test for surface resistivity 70 (see FIG. 3B), an array of composite panels were utilized that had levels 57 (see FIG. 3B) of time of sanding correlating to: 1—0 SEC (zero second) (no sanding) 57a, 2—5 SEC (five seconds) 57b, 3—10 SEC (ten seconds) 57c, 4—30 SEC (thirty seconds) 57d, 5—1 MIN (one minute) 57e, and 6—2 MIN (two minutes) 57f (see FIGS. 9-13). Sanding for 1 (one) minute and 3-VERY LIGHT 56c were the control process baselines.

Composite Surface Analysis

Pre-bond composite surfaces were characterized before and after composite surface treatment. The composite surfaces of the composite panels were measured using the ohm meter 66 to take electrical resistance measurements 72 and surface resistivity measurement 74.

Electrical Resistance

Electrical resistance measurements 72 were taken using the ohm meter 66 comprising an electrical resistance ohm meter 66a, in the form of a FLUKE Model 77 Series IV digital multimeter from Fluke Corporation. (FLUKE is a registered trademark owned by Fluke Corporation of Everett, Wash.) Initial measurements were collected using the point-to-point probe method 76 (see FIG. 5) with point probes 78 (see FIG. 5) having radiused or rounded probe tips, where the probe tips were placed in contact with the exposed carbon fibers 80a (see FIG. 5) on both the composite surface 26 (see FIG. 5) and the edge 27 (see FIG. 5), such as the nearest trimmed edge, of a composite panel 34a (see FIG. 5), with various levels 56 (see FIG. 5) of the amount of abrading 48 (see FIG. 3B), or sanding 48a (see FIG. 3B).

Now referring to FIG. 5, FIG. 5 is an illustration of a top view of an ohm meter 66, such as the electrical resistance ohm meter 66a, in use by a user 110 measuring electrical resistance 68 (see FIG. 3B) at various levels 56 of the amount of abrading 48 (see FIG. 3B), such as sanding 48a (see FIG. 3B), on a composite panel 34a, in the form of an abraded panel 35, such as a sanded panel 35a, having an abraded surface 49, such as a sanded surface 49a, using the point-to-point probe method 76.

As shown in FIG. 5, the ohm meter 66 detects electrical resistance 68 and takes electrical resistance measurements 72 at the levels 56 of the amount of abrading 48, such as sanding 48a, of 1—NONE (no sanding) 56a, 2—VERY VERY LIGHT 56b, 3—VERY LIGHT 56c, 4—LIGHT 56d, 5—MEDIUM LIGHT 56e, 6—SEMI-FULL 56f, and 7—FULL 56g, of the composite surfaces 26, such as the test composite surfaces 26a, for example, the carbon fiber epoxy composite surfaces 26c, of the composite structure 28, such as the test composite structure 28a. As further shown in FIG. 6, the surface analysis tool 60, such as in the form of the ohm meter 66, is a portable surface analysis tool 60a that may be hand-held and manually used to take the electrical resistance measurements 72.

As further shown in FIG. 5, the point-to-point probe method 76 uses a first point probe 78a in contact with exposed carbon fibers 80a on the composite surface 26, such as the test composite surface 26a of the composite structure 28, such as the test composite structure 28a. As shown in FIG. 5, the first point probe 78a has a first point probe wire connection 79a connected to the surface analysis tool 60 comprising the ohm meter 66. As further shown in FIG. 5, the point-to-point probe method 76 uses a second point probe 78*b* in contact with an edge 27, such as a test composite edge 27*a*, of the composite structure 28, such as the test composite structure 28*a*. As shown in FIG. 5, the second point probe 78*b* has a second point probe wire connection 79*b* connected to the surface analysis tool 60 comprising the ohm meter 66. As shown in FIG. 5, the display on the ohm meter 66 shows a electrical resistance measurement 72 of "180".

Now referring to FIG. 6, FIG. 6 is an illustration of a graph 112 showing electrical resistance measurements 72 of carbon fiber epoxy composite surfaces 26*c* (see FIG. 5) at various levels 56 of the amount of abrading 48 (see FIG. 3B), such as sanding 48*a* (see FIG. 3B), where the point-to-point probe method 76 (see FIG. 5) was used, and the surface analysis tool 60 (see FIG. 5) comprising the ohm meter 66 (see FIG. 5), such as the electrical resistance ohm meter 66*a*, was used, in the form of a FLUKE Model 77 Series IV digital multimeter from Fluke Corporation.

As shown in FIG. 6, the graph 112 shows electrical resistance 68, in Ohms, on the y-axis, and shows the levels 56 of the amount of abrading 48 (see FIG. 3B), such as sanding 48*a* (see FIG. 3B), on the x-axis. As shown in FIG. 6, the levels 56 of the amount of abrading 48, such as sanding 48*a*, include: 1—NONE (no sanding) 56*a*, 2—VERY VERY LIGHT 56*b*, 3—VERY LIGHT 56*c*, 4—LIGHT 56*d*, 5—MEDIUM LIGHT 56*e*, 6—SEMI-FULL 56*f*, and 7—FULL 56*g*. FIG. 6 further shows the electrical resistance plots 114 numbered 114*a*-114*g*, where plot 114*a* showed an electrical resistance 68 of 301 Ohms at level 56*a* (1—NONE (no sanding)); plot 114*b* showed an electrical resistance 68 of 183 Ohms at level 56*b* (2—VERY VERY LIGHT); plot 114*c* showed an electrical resistance 68 of 47 Ohms at level 56*c* (3—VERY LIGHT); plot 114*d* showed an electrical resistance 68 of 28 Ohms at level 56*d* (4—LIGHT); plot 114*e* showed an electrical resistance 68 of 36 Ohms at level 56*e* (5—MEDIUM LIGHT); plot 114*f* showed an electrical resistance 68 of 38 Ohms at level 56*f* (6—SEMI-FULL); and plot 114*g* showed an electrical resistance 68 of 23 Ohms at level 56*g* (7—FULL).

The test result measurements 64*a* (see FIG. 3B) showed a clear correlation between the electrical resistance 68 in Ohms and the levels 56 of the amount of abrading 48, such as sanding 48*a*. An overall decrease in the electrical resistance measurements 72 was observed with increased abrading 48, such as sanding 48*a*, potentially due to the reduction in the amount of organic epoxy resin on the surface and exposure of the conductive carbon fibers 80*b*, with increased sanding time.

Surface Resistivity

Surface resistivity measurements 74 were taken using the ohm meter 66 comprising the surface resistivity ohm meter 66*b*, in the form of a MEGGER Model MIT 485/2 surface resistivity testing instrument from Megger Instruments Limited. (MEGGER is a registered trademark owned by Megger Instruments Limited of Kent, United Kingdom.)

Due to the need to measure the sanding level on composite surfaces 26 only, without an edge 27 exposed, a surface resistivity ohm meter 66*b* (see FIGS. 7, 8) was employed. A surface resistivity probe 85 (see FIGS. 7, 8), such as a 1 (one) square inch aluminum probe 85*b* (see FIGS. 7, 8), was placed on composite surfaces 26 (see FIGS. 7, 8) of six (6) individual 7 inch by 12 inch composite panels 34*a* (see FIGS. 7, 8), one at a time, and 5 (five) composite surfaces 26 were abraded surfaces 49 (see FIGS. 7, 8), such as sanded surfaces 49*a* (see FIGS. 7, 8) and one composite surface 26 was unabraded, or unsanded. In one test, a twenty pound (20 lb.) weight 86*a* (see FIG. 7) was used to apply controlled pressure 88 (see FIG. 3B) to the surface resistivity probe 85 (see FIG. 7), such as the 1 (one) square inch aluminum probe 85*b* (see FIG. 7), during measurement of surface resistivity 70. Either individual data points, individual maximums, or individual minimums were measured and taken.

In another test, a forty pound (40 lb.) weight 86*b* (see FIG. 8) (or two (2) twenty pound (20 lb.) weights 86*a*) was used to apply controlled pressure 88 (see FIG. 3B) to the surface resistivity probe 85 (see FIG. 8), such as the 1 (one) square inch aluminum probe 85*b* (see FIG. 8), during measurement of surface resistivity 70. Either individual data points, individual maximums, or individual minimums were measured and taken.

The results showed that there was a correlation between sanded surface preparation and surface resistivity 70 when the force or weight of the surface resistivity probe 85 was controlled (see FIGS. 9-13). The test result measurements 64*a* (see FIG. 3B), such as the surface resistivity measurements 74, showed a correlation between the abrasive surface preparation 42 (see FIG. 3B), such as the sanding surface preparation 42*a* (see FIG. 3B), and the surface resistivity 70 in Ohms/sq. and the levels 57 of the time of abrading 48, such as sanding 48*a*, when the surface resistivity probe 85 (see FIG. 7) pressure or force was controlled with the 20 lb. (twenty pound) weight 86*a* (see FIG. 7) placed over the surface resistivity probe 85 (see FIG. 7), or with the 40 lb. (forty pound) weight 86*b* (see FIG. 8) placed over the surface resistivity probe 85 (see FIG. 8). An overall decrease in the surface resistivity measurements 74 was observed with increased abrading 48, such as sanding 48*a*, potentially due to the reduction in the amount of organic epoxy resin on the surface and exposure of the conductive carbon fibers 80*b*, with increased sanding time.

Now referring to FIG. 7, FIG. 7 is an illustration of a perspective front view of an ohm meter 66, such as a surface resistivity ohm meter 66*b*, in operation to take surface resistivity measurements 74 of surface resistivity 70 (see FIG. 3B) at various levels 57 of the time of abrading 48 (see FIG. 3B), or sanding 48*a* (see FIG. 3B), on 6 (six) individual composite panels 34*a*. Number 1 composite panel 34*a* (see FIG. 7) comprises an unabraded panel, or unsanded panel. Numbers 2-6 composite panels 34*a* (see FIG. 7) comprise abraded panels 35, such as sanded panels 35*a*, having abraded surfaces 49, such as sanded surfaces 49*a*. A version of a weighted probe method 84 (see FIG. 3B), such as a first weighted probe method 84*a* (see FIG. 3B), was used.

As shown in FIG. 7, the weighted probe method 84, such as the first weighted probe method 84*a*, uses a surface resistivity probe 85, such as a weighted surface resistivity probe 85*a*, having a weight 86 placed on the surface resistivity probe 85, to apply the controlled pressure 88 (see FIG. 3B) to the surface resistivity probe 85, during measuring. The surface resistivity probe 85, such as the weighted surface resistivity probe 85*a*, is in in contact with one of the one or more abrasive surface preparation locations 44 (see FIG. 7), and with the exposed carbon fibers 80*a*, on the composite surface 26 (see FIG. 7). As shown in FIG. 7, in one version, the weight 86 placed on the surface resistivity probe 85 comprises a twenty pound (20 lb.) weight 86*a* placed on top of the surface resistivity probe 85, during measuring with the surface resistivity ohm meter 66*b*. As further shown in FIG. 7, the surface resistivity probe 85, such as the weighted surface resistivity probe 85*a*, has a first wire connection 87*a* and a second wire connection 87*b* connected to the surface analysis tool 60 comprising the ohm meter 66, for example, the surface resistivity ohm meter 66*b*.

As shown in FIG. 7, the ohm meter 66 detects surface resistivity 70 and takes surface resistivity measurements 74 at the levels 57 of the time of abrading 48, such as sanding 48*a*, of: 1—0 SEC (zero second) (no sanding) 57*a*, 2—5 SEC (five seconds) 57*b*, 3—10 SEC (ten seconds) 57*c*, 4—30 SEC (thirty seconds) 57*d*, 5—1 MIN (one minute) 57*e*, and 6—2 MIN (two minutes) 57*f*, of the composite surfaces 26, such as the test composite surfaces 26*a*, for example, the carbon fiber epoxy composite surfaces 26*c* (see FIG. 3A), of the composite structure 28, such as the test composite structure 28*a*. As further shown in FIG. 7, the surface analysis tool 60, such as in the form of the ohm meter 66, is a portable surface analysis tool 60*a* that may be hand-held and manually used to take the surface resistivity measurements 74. As shown in FIG. 7, the display on the ohm meter 66 shows a surface resistivity measurement 74 of "25.6".

Now referring to FIG. 8, FIG. 8 is an illustration of a perspective front view of an ohm meter 66, such as a surface resistivity ohm meter 66*b*, in operation to take surface resistivity measurements 74 of surface resistivity 70 (see FIG. 3B) at various levels 57 of the time of abrading 48 (see FIG. 3B), such as sanding 48*a* (see FIG. 3B), on 6 (six) individual composite panels. Number 1 composite panel 34*a* (see FIG. 7) comprises an unabraded panel, or unsanded panel. Numbers 2-6 composite panels 34*a* (see FIG. 7) comprise abraded panels 35 (see FIG. 3A), such as sanded panels 35*a* (see FIG. 3A), having abraded surfaces 49 (see FIG. 3B), such as sanded surfaces 49*a* (see FIG. 3B). Another version of a weighted probe method 84 (see FIG. 3B), such as a second weighted probe method 84*b* (see FIG. 3B), was used.

As shown in FIG. 8, the weighted probe method 84, such as the second weighted probe method 84*b*, uses a surface resistivity probe 85, such as a weighted surface resistivity probe 85*a*, having a weight 86 placed on the surface resistivity probe 85, to apply a controlled pressure 88 (see FIG. 3B) to the surface resistivity probe 85, during measuring. The surface resistivity probe 85, such as the weighted surface resistivity probe 85*a* is in in contact with one of the one or more abrasive surface preparation locations 44 (see FIG. 8), and with the exposed carbon fibers 80*a*, on the composite surface 26 (see FIG. 8). As shown in FIG. 8, in another version, the weight 86 placed on the surface resistivity probe 85 comprises a forty pound (40 lb.) weight 86*b* (or, alternatively, two (2) twenty pound (20 lb.) weights 86*a*) placed on top of the surface resistivity probe 85, during measuring with the surface resistivity ohm meter 66*b*. As further shown in FIG. 8, the surface resistivity probe 85, such as the weighted surface resistivity probe 85*a*, has the first wire connection 87*a* and the second wire connection 87*b* connected to the surface analysis tool 60 comprising the ohm meter 66, for example, the surface resistivity ohm meter 66*b*.

As shown in FIG. 8, the ohm meter 66 detects surface resistivity 70 and takes surface resistivity measurements 74 at the levels 57 of the time of abrading 48, such as sanding 48*a*, of: 1—0 SEC (zero second) (no sanding) 57*a*, 2—5 SEC (five seconds) 57*b*, 3—10 SEC (ten seconds) 57*c*, 4—30 SEC (thirty seconds) 57*d*, 5—1 MIN (one minute) 57*e*, and 6—2 MIN (two minutes) 57*f*, of the composite surfaces 26, such as the test composite surfaces 26*a*, for example, the carbon fiber epoxy composite surfaces 26*c*, of the composite structure 28, such as the test composite structure 28*a*. As further shown in FIG. 8, the surface analysis tool 60, such as in the form of the ohm meter 66, is a portable surface analysis tool 60*a* that may be hand-held and manually used to take the surface resistivity measurements 74. As shown in FIG. 8, the display on the ohm meter 66 shows a surface resistivity measurement 74 of "15.0".

Figure 9:
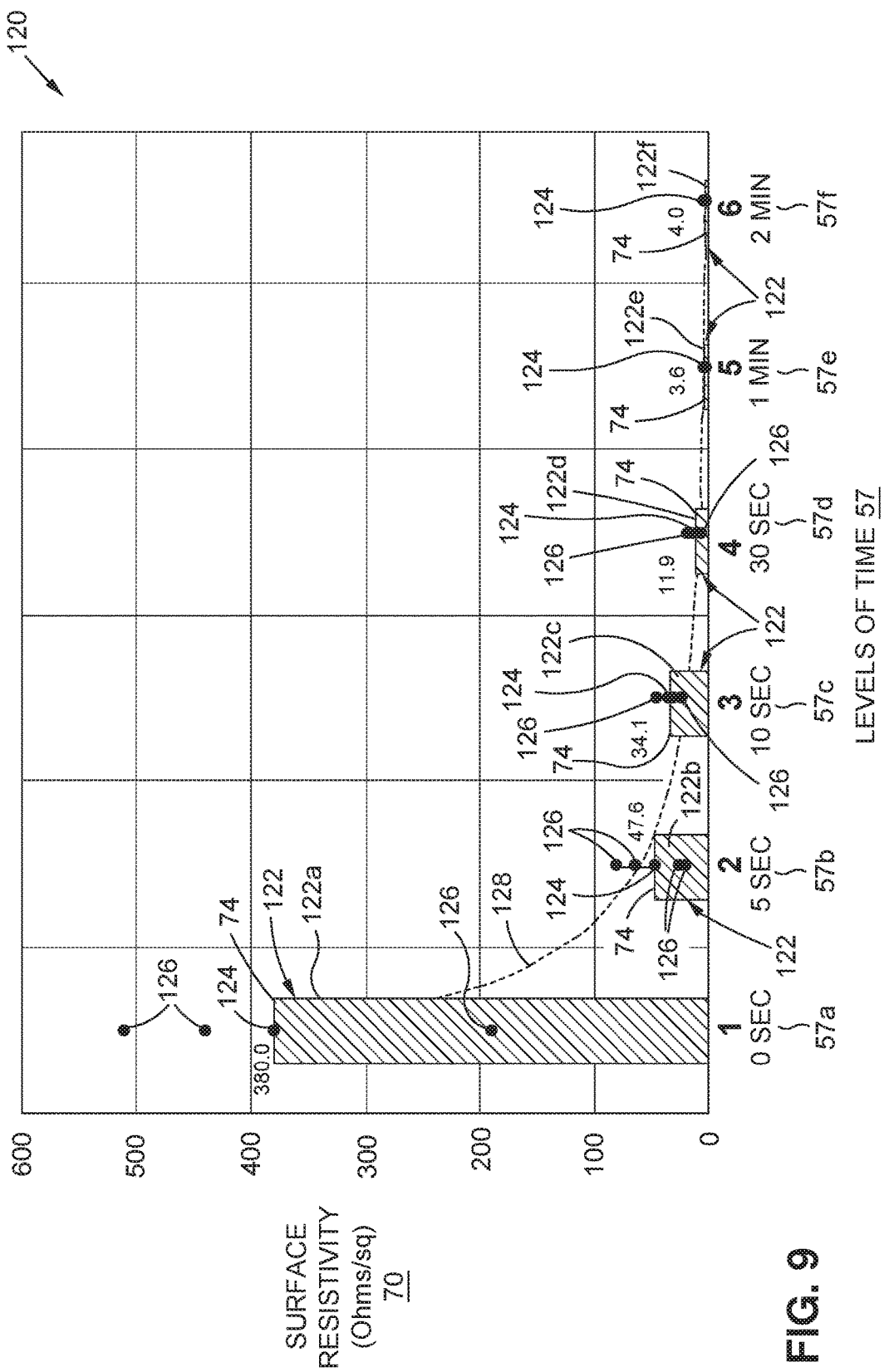
FIG. 9 is an illustration of a graph showing surface resistivity measurements of average and individual data points for carbon fiber epoxy composite surfaces at various levels of times of sanding, where a weighted probe method with a twenty pound (20 lb.) weight was used.

Now referring to FIG. 9, FIG. 9 is an illustration of a graph 120 showing surface resistivity measurements 74 of average data points 134 and individual data points 136 of carbon fiber epoxy composite surfaces 26*c* (see FIG. 7) at various levels 57 of time of abrading 48 (see FIG. 3B), such as sanding 48*a* (see FIG. 3B), where the weighted probe method 84 (see FIG. 7) was used, and the surface analysis tool 60 comprising the ohm meter 66, such as the surface resistivity ohm meter 66*b*, in the form of a MEGGER Model MIT 485/2 surface resistivity testing instrument from Megger Instruments Limited, was used. The surface resistivity measurements 74 were taken using a surface resistivity probe 85 (see FIG. 7), such as a 1 sq. in. (one square inch) aluminum probe 85*b* (see FIG. 7), with the 20 lb. (twenty pound) weight 86*a* (see FIG. 7) placed over the surface resistivity probe 85 (see FIG. 7).

As shown in FIG. 9, the graph 120 shows surface resistivity 70, in Ohms/sq. (Ohms per square), on the y-axis, and shows the levels 57 of the time of abrading 48, such as sanding 48*a*, on the x-axis. As shown in FIG. 9, the levels 57 of the time of abrading 48 (see FIG. 3B), such as sanding 48*a* (see FIG. 3B), include: 1—0 SEC (zero seconds) (no sanding) 57*a*, 2—5 SEC (five seconds) 57*b*, 3—10 SEC (ten seconds) 57*c*, 4—30 SEC (thirty seconds) 57*d*, 5—1 MIN (one minute) 57*e*, and 6—2 MIN (two minutes) 57*f*.

FIG. 9 further shows the surface resistivity plots 122 numbered 122*a*-122*f*, where each surface resistivity plot 122 shows average data points 124 and individual data points 126. FIG. 9 further shows a plot curve 128 between the surface resistivity plots 122. As shown in FIG. 9, plot 122*a* showed surface resistivity 70 of 380.0 Ohms/sq. at level 57*a* (1—0 SEC (zero second) (no sanding)); plot 122*b* showed surface resistivity 70 of 27.6 Ohms/sq. at level 57*b* (2—5 SEC (five seconds)); plot 122*c* showed surface resistivity 70 of 34.1 Ohms/sq. at level 57*c* (3—10 SEC (ten seconds)); plot 122*d* showed surface resistivity 70 of 11.9 Ohms/sq. at level 57*d* (4—30 SEC (thirty seconds)); plot 122*e* showed surface resistivity 70 of 3.6 Ohms/sq. at level 57*e* (5—1 MIN (one minute)); and plot 122*f* showed surface resistivity 70 of 4.0 Ohms/sq. at level 57*f* (6—2 MIN (two minutes)).

The test result measurements 64*a* (see FIG. 3B) showed a correlation between the abrasive surface preparation 42 (see FIG. 3B), such as the sanding surface preparation 42*a* (see FIG. 3B), and the surface resistivity 70 in Ohms/sq. and the levels 57 of the time of abrading 48, such as sanding 48*a*, when the surface resistivity probe 85 (see FIG. 7) pressure or force was controlled with the 20 lb. (twenty pound) weight 86*a* (see FIG. 7) placed over the surface resistivity probe 85 (see FIG. 7). An overall decrease in the surface resistivity measurements 74 was observed with increased abrading 48, such as sanding 48*a*, potentially due to the reduction in the amount of organic epoxy resin on the surface and exposure of the conductive carbon fibers 80*b*, with increased sanding time.

Figure 10:
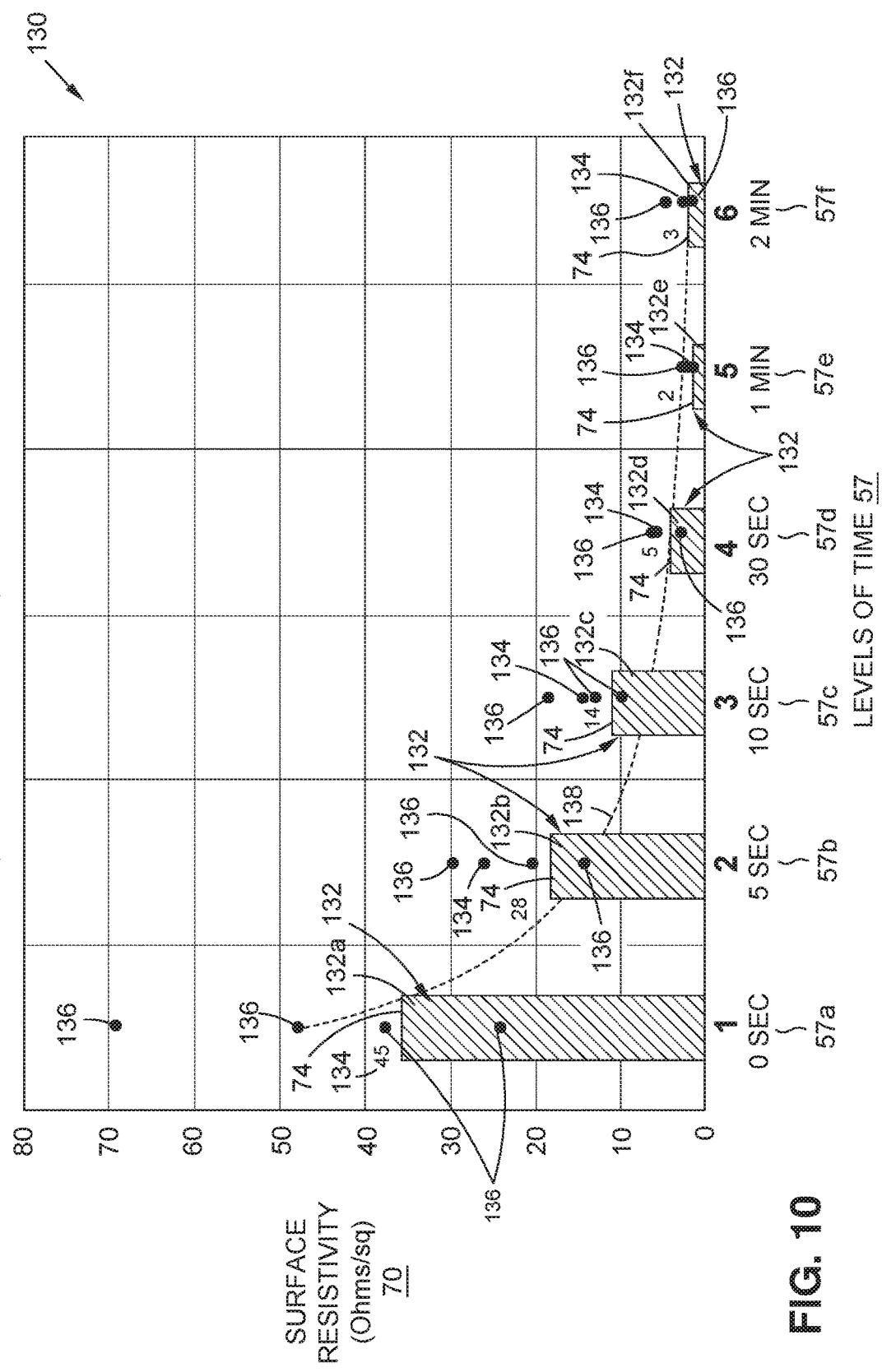
FIG. 10 is an illustration of a graph showing surface resistivity measurements of average and individual data points of carbon fiber epoxy composite surfaces at various levels of times of sanding, where a weighted probe method with a forty pound (40 lb.) weight was used.

Now referring to FIG. 10, FIG. 10 is an illustration of a graph 130 showing surface resistivity measurements 74 of average data points 134 and individual data points 136 of carbon fiber epoxy composite surfaces 26*c* (see FIG. 8) at various levels 57 of time of abrading 48 (see FIG. 3B), such as sanding 48*a* (see FIG. 3B), where the weighted probe method 84 (see FIG. 8) was used, and the surface analysis tool 60 comprising the ohm meter 66, such as the surface resistivity ohm meter 66b, in the form of the MEGGER Model MIT 485/2 surface resistivity testing instrument from Megger Instruments Limited, was used. The surface resistivity measurements 74 were taken using the surface resistivity probe 85 (see FIG. 8), such as a 1 sq. in. (one square inch) aluminum probe 85b (see FIG. 8), with the 40 lb. (forty pound) weight 86b (see FIG. 8) placed over the surface resistivity probe 85 (see FIG. 8).

As shown in FIG. 10, the graph 130 shows surface resistivity 70, in Ohms/sq. (Ohms per square), on the y-axis, and shows the levels 57 of the time of abrading 48, such as sanding 48a, on the x-axis. As shown in FIG. 10, the levels 57 of the time of abrading 48 (see FIG. 3B), such as sanding 48a (see FIG. 3B), include: 1—0 SEC (zero seconds) (no sanding) 57a, 2—5 SEC (five seconds) 57b, 3—10 SEC (ten seconds) 57c, 4—30 SEC (thirty seconds) 57d, 5—1 MIN (one minute) 57e, and 6—2 MIN (two minutes) 57f.

FIG. 10 further shows the surface resistivity plots 132 numbered 132a-132f, where each surface resistivity plot 132 shows average data points 134 and individual data points 136. FIG. 10 further shows a plot curve 138 between the surface resistivity plots 132. As shown in FIG. 10, plot 132a showed surface resistivity 70 of 45 Ohms/sq. at level 57a (1—0 SEC (zero second) (no sanding)); plot 132b showed surface resistivity 70 of 28 Ohms/sq. at level 57b (2—5 SEC (five seconds)); plot 132c showed surface resistivity 70 of 14 Ohms/sq. at level 57c (3—10 SEC (ten seconds)); plot 132d showed surface resistivity 70 of 5 Ohms/sq. at level 57d (4—30 SEC (thirty seconds)); plot 132e showed surface resistivity 70 of 2 Ohms/sq. at level 57e (5—1 MIN (one minute)); and plot 132f showed surface resistivity 70 of 3 Ohms/sq. at level 57f (6—2 MIN (two minutes)).

The test result measurements 64a (see FIG. 3B) showed a correlation between the abrasive surface preparation 42 (see FIG. 3B), such as the sanding surface preparation 42a (see FIG. 3B), and the surface resistivity 70 in Ohms/sq. and the levels 57 of the time of abrading 48, such as sanding 48a, when the surface resistivity probe 85 (see FIG. 8) pressure or force was controlled with the 40 lb. (forty pound) weight 86b (see FIG. 8) placed over the surface resistivity probe 85 (see FIG. 8). An overall decrease in the surface resistivity measurements 74 was observed with increased abrading 48, such as sanding 48a, potentially due to the reduction in the amount of organic epoxy resin on the surface and exposure of the conductive carbon fibers 80b, with increased sanding time.

Figure 11:
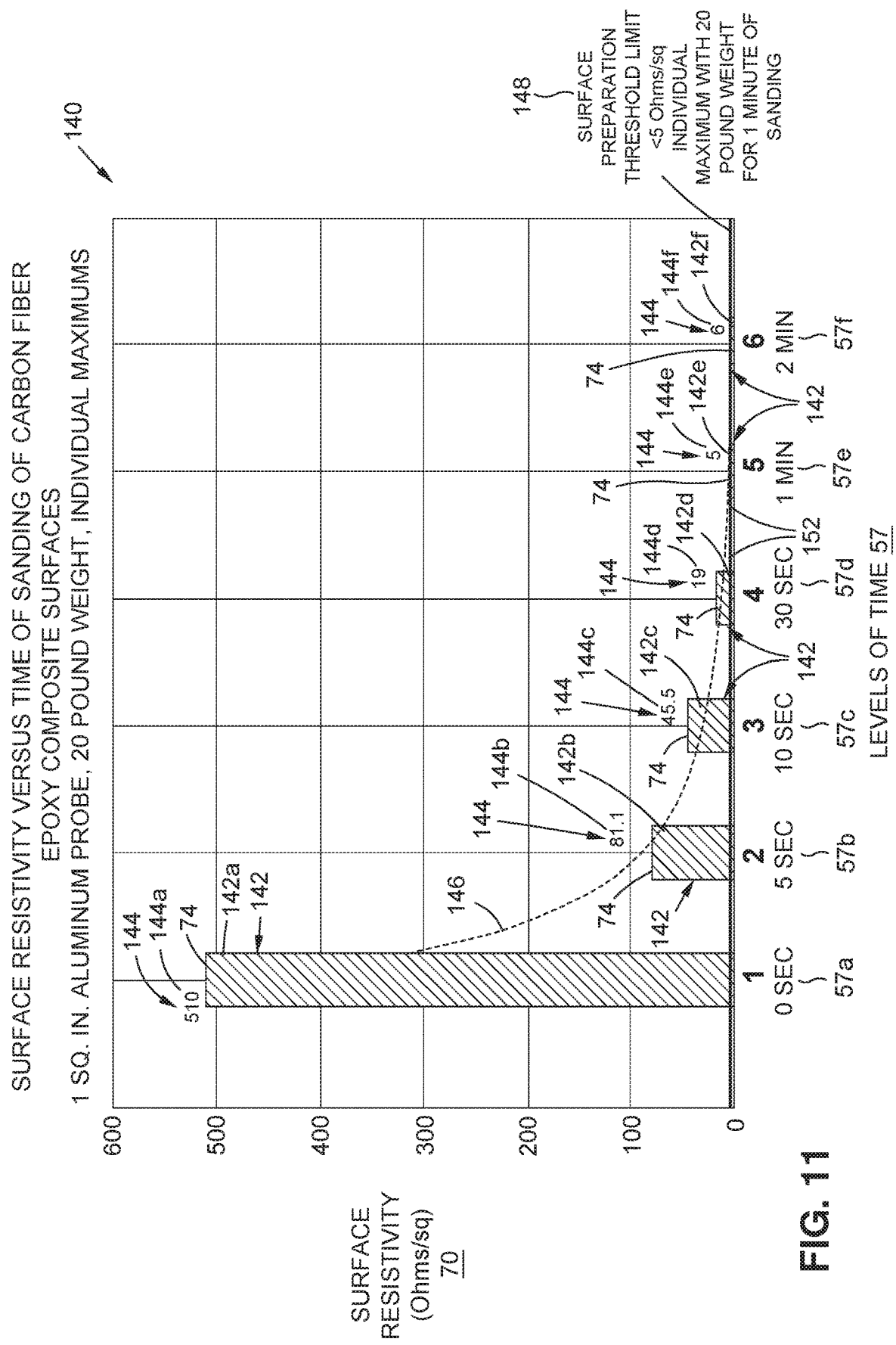
FIG. 11 is an illustration of a graph showing surface resistivity measurements of individual maximums of carbon fiber epoxy composite surfaces at various levels of times of sanding, where a weighted probe method with a twenty pound (20 lb.) weight was used.

Now referring to FIG. 11, FIG. 11 is an illustration of a graph 140 showing surface resistivity measurements 74 of individual maximums 144 of carbon fiber epoxy composite surfaces 26c (see FIG. 2) at various levels 57 of time of abrading 48 (see FIG. 3B), such as sanding 48a (see FIG. 3B), where the weighted probe method 84 (see FIG. 7) was used, and the surface analysis tool 60 comprising the ohm meter 66, such as the surface resistivity ohm meter 66b, in the form of the MEGGER Model MIT 485/2 surface resistivity testing instrument from Megger Instruments Limited, was used. The surface resistivity measurements 74 were taken using the surface resistivity probe 85 (see FIG. 7), such as a 1 sq. in. (one square inch) aluminum probe 85b (see FIG. 7), with the 20 lb. (twenty pound) weight 86a (see FIG. 7) placed over the surface resistivity probe 85 (see FIG. 7).

As shown in FIG. 11, the graph 140 shows surface resistivity 70, in Ohms/sq. (Ohms per square), on the y-axis, and shows the levels 57 of the time of abrading 48, such as sanding 48a, on the x-axis. As shown in FIG. 11, the levels 57 of the time of abrading 48 (see FIG. 3B), such as sanding 48a (see FIG. 3B), include: 1—0 SEC (zero second) (no sanding) 57a, 2—5 SEC (five seconds) 57b, 3—10 SEC (ten seconds) 57c, 4—30 SEC (thirty seconds) 57d, 5—1 MIN (one minute) 57e, and 6—2 MIN (two minutes) 57f.

FIG. 11 further shows the surface resistivity plots 142 numbered 142a-142f, where each surface resistivity plot 142 shows individual maximums 144. FIG. 11 further shows a plot curve 146 between the surface resistivity plots 142. As shown in FIG. 11, plot 142a showed surface resistivity 70 of an individual maximum 144a of 510 Ohms/sq. at level 57a (1—0 SEC (zero second) (no sanding)); plot 142b showed surface resistivity 70 of an individual maximum 144b of 81.1 Ohms/sq. at level 57b (2—5 SEC (five seconds)); plot 142c showed surface resistivity 70 of an individual maximum 144c of 45.5 Ohms/sq. at level 57c (3—10 SEC (ten seconds)); plot 142d showed surface resistivity 70 of an individual maximum 144d of 19 Ohms/sq. at level 57d (4—30 SEC (thirty seconds)); plot 142e showed surface resistivity 70 of an individual maximum 144e of 5 Ohms/sq. at level 57e (5—1 MIN (one minute)); and plot 142f showed surface resistivity 70 of an individual maximum 144f of 6 Ohms/sq. at level 57f (6—2 MIN (two minutes)).

As shown in FIG. 11, a surface preparation threshold limit 148, or baseline, for the surface resistivity 70 for abrasive surface preparation 42 (see FIG. 3B), such as sanding surface preparation 42a (see FIG. 3B), with a 20 pound weight, for 1 (one) minute of abrading 48 (see FIG. 3B), such as sanding 48a (see FIG. 3B), was less than 5 (five) Ohms/sq.

The test result measurements 64a (see FIG. 3B) showed a correlation between the abrasive surface preparation 42 (see FIG. 3B), such as the sanding surface preparation 42a (see FIG. 3B), and the surface resistivity 70 in Ohms/sq. and the levels 57 of the time of abrading 48, such as sanding 48a, when the surface resistivity probe 85 (see FIG. 7) pressure or force was controlled with the 20 lb. (twenty pound) weight 86a (see FIG. 7) placed over the surface resistivity probe 85 (see FIG. 7). An overall decrease in the surface resistivity measurements 74 was observed with increased abrading 48, such as sanding 48a, potentially due to the reduction in the amount of organic epoxy resin on the surface and exposure of the conductive carbon fibers 80b, with increased sanding time.

Figure 12:
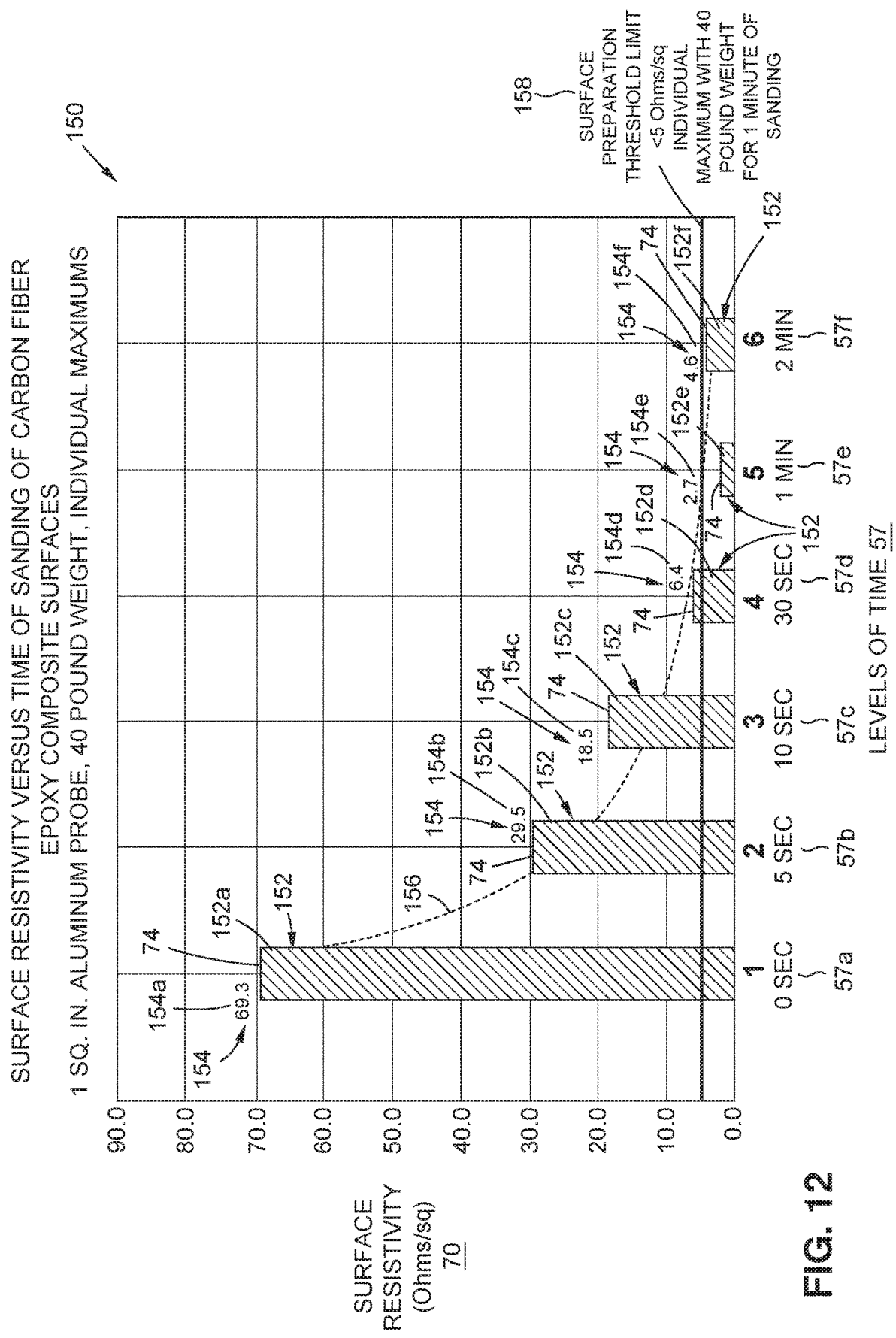
FIG. 12 is an illustration of a graph showing surface resistivity measurements of individual maximums of carbon fiber epoxy composite surfaces at various levels of times of sanding, where a weighted probe method with a forty pound (40 lb.) weight was used.

Now referring to FIG. 12, FIG. 12 is an illustration of a graph 150 showing surface resistivity measurements 74 of individual maximums 154 of carbon fiber epoxy composite surfaces 26c (see FIG. 2) at various levels 57 of time of abrading 48 (see FIG. 3B), such as sanding 48a (see FIG. 3B), where the weighted probe method 84 (see FIG. 8) was used, and the surface analysis tool 60 comprising the ohm meter 66, such as the surface resistivity ohm meter 66b, in the form of the MEGGER Model MIT 485/2 surface resistivity testing instrument from Megger Instruments Limited, was used. The surface resistivity measurements 74 were taken using the surface resistivity probe 85 (see FIG. 8), such as a 1 sq. in. (one square inch) aluminum probe 85b (see FIG. 8), with the 40 lb. (forty pound) weight 86b (see FIG. 8) placed over the surface resistivity probe 85 (see FIG. 8).

As shown in FIG. 12, the graph 150 shows surface resistivity 70, in Ohms/sq. (Ohms per square), on the y-axis, and shows the levels 57 of the time of abrading 48, such as sanding 48a, on the x-axis. As shown in FIG. 12, the levels 57 of the time of abrading 48 (see FIG. 3B), such as sanding 48a (see FIG. 3B), include: 1—0 SEC (zero second) (no sanding) 57a, 2—5 SEC (five seconds) 57b, 3—10 SEC (ten seconds) 57c, 4—30 SEC (thirty seconds) 57d, 5—1 MIN (one minute) 57e, and 6—2 MIN (two minutes) 57f.

FIG. 12 further shows the surface resistivity plots 152 numbered 152a-152f, where each surface resistivity plot 152 shows individual maximums 154. FIG. 12 further shows a plot curve 156 between the surface resistivity plots 152. As shown in FIG. 12, plot 152a showed surface resistivity 70 of an individual maximum 154a of 69.3 Ohms/sq. at level 57a (1—0 SEC (zero second) (no sanding)); plot 152b showed surface resistivity 70 of an individual maximum 154b of 29.5 Ohms/sq. at level 57b (2—5 SEC (five seconds)); plot 152c showed surface resistivity 70 of an individual maximum 154c of 18.5 Ohms/sq. at level 57c (3—10 SEC (ten seconds)); plot 152d showed surface resistivity 70 of an individual maximum 154d of 6.4 Ohms/sq. at level 57d (4—30 SEC (thirty seconds)); plot 152e showed surface resistivity 70 of an individual maximum 154e of 2.7 Ohms/sq. at level 57e (5—1 MIN (one minute)); and plot 152f showed surface resistivity 70 of an individual maximum 154f of 4.6 Ohms/sq. at level 57f (6—2 MIN (two minutes)).

As shown in FIG. 12, a surface preparation threshold limit 158, or baseline, for the surface resistivity 70 for abrasive surface preparation 42 (see FIG. 3B), such as sanding surface preparation 42a (see FIG. 3B), with a 40 pound weight, for 1 (one) minute of abrading 48 (see FIG. 3B), such as sanding 48a (see FIG. 3B), was less than 5 (five) Ohms/sq.

The test result measurements 64a (see FIG. 3B) showed a correlation between the abrasive surface preparation 42 (see FIG. 3B), such as the sanding surface preparation 42a (see FIG. 3B), and the surface resistivity 70 in Ohms/sq. and the levels 57 of the time of abrading 48, such as sanding 48a, when the surface resistivity probe 85 (see FIG. 8) pressure or force was controlled with the 40 lb. (forty pound) weight 86b (see FIG. 8) placed over the surface resistivity probe 85 (see FIG. 8). An overall decrease in the surface resistivity measurements 74 was observed with increased abrading 48, such as sanding 48a, potentially due to the reduction in the amount of organic epoxy resin on the surface and exposure of the conductive carbon fibers 80b, with increased sanding time.

Figure 13:
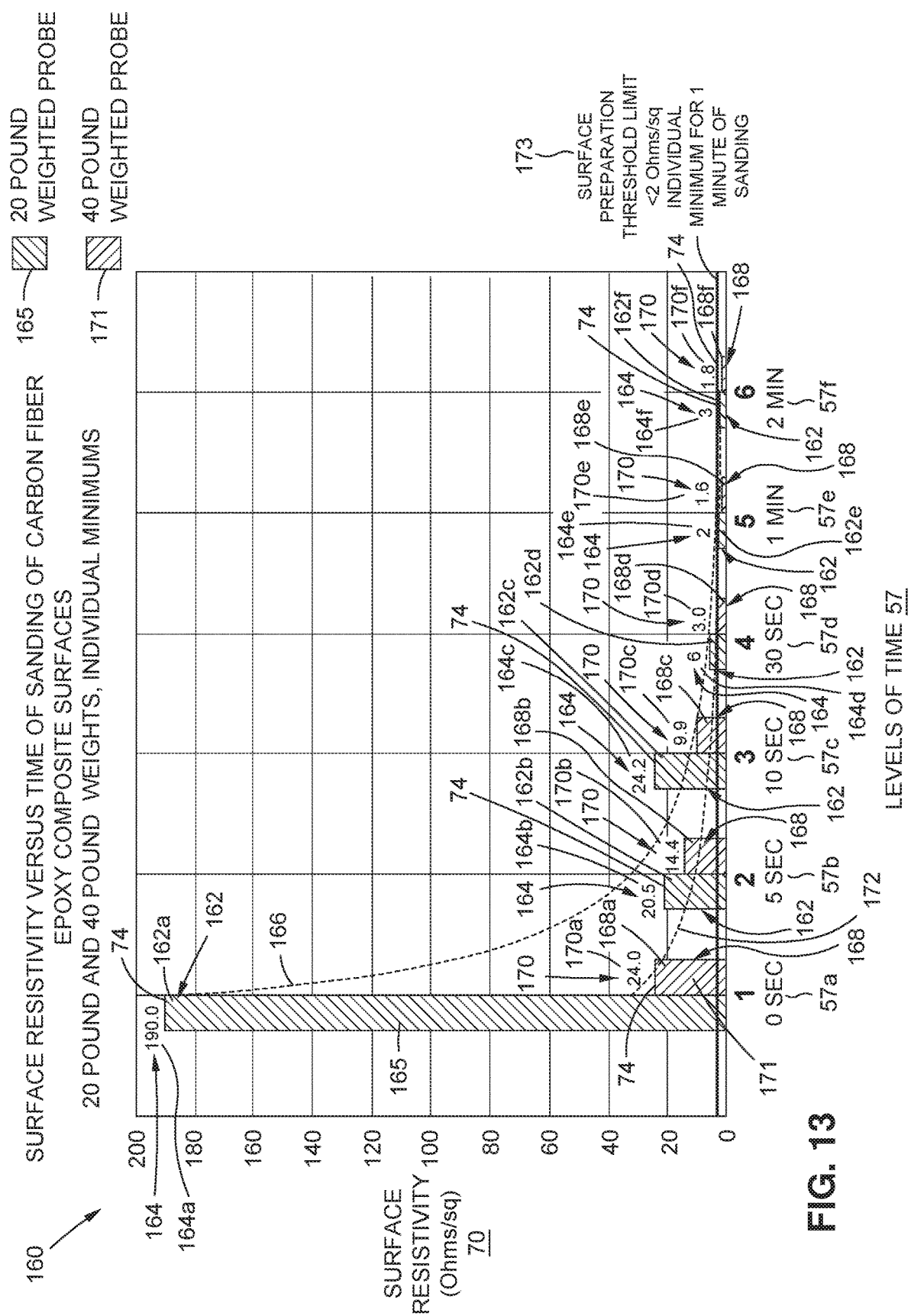
FIG. 13 is an illustration of a graph showing surface resistivity measurements of individual minimums of carbon fiber epoxy composite surfaces at various levels of times of sanding, where a weighted probe method with twenty pound (20 lb.) and forty pound (40 lb.) weights were used.

Now referring to FIG. 13, FIG. 13 is an illustration of a graph 160 showing surface resistivity measurements 74 of individual minimums 164 with the 20 pound weighted probe 165 placed over the surface resistivity probe 85 (see FIG. 7), and of individual minimums 170 with the 40 pound weighted probe 171 placed over the surface resistivity probe 85 (see FIG. 8). The graph 160 further shows the surface resistivity measurements 74 of carbon fiber epoxy composite surfaces 26c (see FIG. 2) at various levels 57 of time of abrading 48 (see FIG. 3B), such as sanding 48a (see FIG. 3B), where the weighted probe method 84 (see FIG. 7) was used, and the surface analysis tool 60 comprising the ohm meter 66, such as the surface resistivity ohm meter 66b, in the form of the MEGGER Model MIT 485/2 surface resistivity testing instrument from Megger Instruments Limited, was used. The surface resistivity measurements 74 were taken using the surface resistivity probe 85 (see FIG. 7), such as a 1 sq. in. (one square inch) aluminum probe 85b (see FIG. 7), with the 20 lb. (twenty pound) weight 86a (see FIG. 7) placed over the surface resistivity probe 85 (see FIG. 7), and with the 40 lb. (forty pound) weight 86b (see FIG. 8) placed over the surface resistivity probe 85 (see FIG. 8).

As shown in FIG. 13, the graph 160 shows surface resistivity 70, in Ohms/sq. (Ohms per square), on the y-axis, and shows the levels 57 of the time of abrading 48, such as sanding 48a, on the x-axis. As shown in FIG. 13, the levels 57 of the time of abrading 48 (see FIG. 3B), such as sanding 48a (see FIG. 3B), include: 1—0 SEC (zero second) (no sanding) 57a, 2—5 SEC (five seconds) 57b, 3—10 SEC (ten seconds) 57c, 4—30 SEC (thirty seconds) 57d, 5—1 MIN (one minute) 57e, and 6—2 MIN (two minutes) 57f.

FIG. 13 further shows the surface resistivity plots 162 numbered 162a-162f, where each surface resistivity plot 162 shows individual minimums 164. FIG. 12 further shows a plot curve 166 between the surface resistivity plots 162. As shown in FIG. 12, plot 162a showed surface resistivity 70 of an individual minimum 164a of 190.0 Ohms/sq. at level 57a (1—0 SEC (zero second) (no sanding)); plot 162b showed surface resistivity 70 of an individual minimum 164b of 20.5 Ohms/sq. at level 57b (2—5 SEC (five seconds)); plot 162c showed surface resistivity 70 of an individual minimum 164c of 24.2 Ohms/sq. at level 57c (3—10 SEC (ten seconds)); plot 162d showed surface resistivity 70 of an individual minimum 146d of 6 Ohms/sq. at level 57d (4—30 SEC (thirty seconds)); plot 162e showed surface resistivity 70 of an individual minimum 164e of 2 Ohms/sq. at level 57e (5—1 MIN (one minute)); and plot 162f showed surface resistivity 70 of an individual minimum 164f of 3 Ohms/sq. at level 57f (6—2 MIN (two minutes)).

FIG. 13 further shows the surface resistivity plots 168 numbered 168a-168f, where each surface resistivity plot 168 shows individual minimums 170. FIG. 13 further shows a plot curve 172 between the surface resistivity plots 168. As shown in FIG. 13, plot 168a showed surface resistivity 70 of an individual minimum 170a of 24.0 Ohms/sq. at level 57a (1—0 SEC (zero second) (no sanding)); plot 168b showed surface resistivity 70 of an individual minimum 170b of 14.4 Ohms/sq. at level 57b (2—5 SEC (five seconds)); plot 168c showed surface resistivity 70 of an individual minimum 170c of 9.9 Ohms/sq. at level 57c (3—10 SEC (ten seconds)); plot 168d showed surface resistivity 70 of an individual minimum 170d of 3.0 Ohms/sq. at level 57d (4—30 SEC (thirty seconds)); plot 168e showed surface resistivity 70 of an individual minimum 170e of 1.6 Ohms/sq. at level 57e (5—1 MIN (one minute)); and plot 168f showed surface resistivity 70 of an individual minimum 170f of 1.8 Ohms/sq. at level 57f (6—2 MIN (two minutes)).

As shown in FIG. 13, a surface preparation threshold limit 173, or baseline, for the surface resistivity 70 for 1 (one) minute of abrading 48, or sanding 48a, is less than 2 (two) Ohms/sq. for the individual minimums.

Summary

The results identified the surface analysis tool 60 comprising the ohm meter 66 to measure electrical resistance 68 and surface resistivity 70, that were used to set target values 62 (see FIG. 3B), or threshold limits, for abrasive surface preparation 42 (see FIG. 3B), such as sanding surface preparation 42a (see FIG. 3B), with manual sanding 48b (see FIG. 3B), using an abrading device 104 (see FIG. 3B), such as a random orbital sander 104a (see FIG. 3B). The results showed that the use of the surface analysis tool 60 successfully detected whether the composite surface 26 (see FIG. 3A), such as the carbon fiber epoxy composite surface 26c (see FIGS. 14A-14F) was sanded or unsanded, and also successfully detected the levels 56 of the amount of sanding 48a or sanding surface preparation 42a, and the levels 57 of the time of sanding 48a or sanding surface preparation 42a. The surface analysis tool 60 defined the operating window and narrowed the limits on sanding parameters. Utilization of the surface analysis tool 60 enables better process control, resulting in robust and reliable bonding.

The results, as shown by the graph 112 (see FIG. 6), showed that the ohm meter 66 comprising the electrical resistance ohm meter 66a, was able to use electrical resistance 68 (see FIG. 3B) to successfully detect the levels 56 (see FIG. 6) of the amount of abrasive surface preparation 42 (see FIG. 3B), such as sanding surface preparation 42a (see FIG. 3B), with good sensitivity, and showed that the ohm meter 66 comprising the electrical resistance ohm meter 66a was able to successfully measure the presence and level 56 of the amount of sanding 48a in a rapid "go/no go" manner. The results showed that using the ohm meter 66 comprising the electrical resistance ohm meter 66a detected whether the composite surface 26 was sanded or unsanded, and also detected the level 56 of the amount of sanding 48a or sanding surface preparation 42a.

The results, as shown by the graph 120 (see FIG. 9), the graph 130 (see FIG. 10), the graph 140 (see FIG. 11), the graph 150 (see FIG. 12), and the graph 160 (see FIG. 13) showed that the ohm meter 66 comprising the surface resistivity ohm meter 66b, was able to use surface resistivity 70 (see FIG. 3B) to successfully detect the levels 57 (see FIGS. 9-13) of the time of abrasive surface preparation 42 (see FIG. 3B), such as sanding surface preparation 42a (see FIG. 3B), with good sensitivity, and showed that the ohm meter 66 comprising the surface resistivity ohm meter 66b was able to successfully measure the presence and level 57 of the time of sanding 48a in a rapid "go/no go" manner. The results showed that using the ohm meter 66 comprising the surface resistivity ohm meter 66b detected whether the composite surface 26 was sanded or unsanded, and also detected the level 57 of the time of sanding 48a or sanding surface preparation 42a.

Now referring to FIGS. 14A-14F, FIGS. 14A-14F are schematic illustrations showing various exposure levels 174 of exposure 178 of carbon fibers 80, such as conductive carbon fibers 80b, for composite surfaces 26, such as carbon fiber epoxy composite surfaces 26c, of composite structures 28, such as test carbon fiber composite structures 28c, at various levels 57 of time of abrasive surface preparation 42 (see FIG. 3B). As shown in FIGS. 14A-14F, the carbon fibers 80, such as conductive carbon fibers 80b, are embedded in resin 82, such as epoxy resin 82a.

Figure 14A:
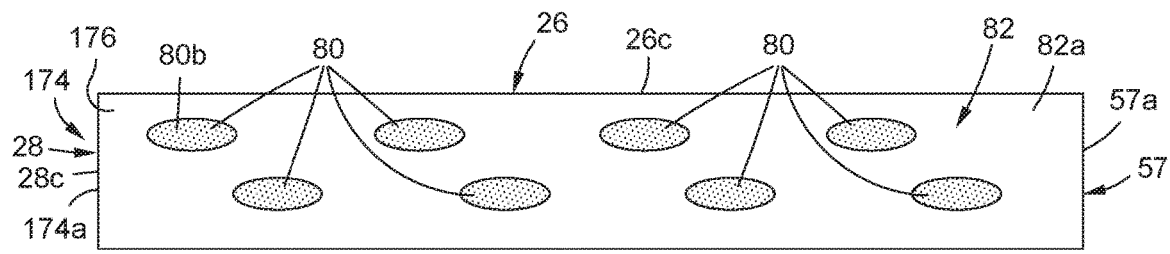
FIGS. 14A-14F are schematic illustrations showing exposure levels of carbon fibers for carbon fiber epoxy composite surfaces at various levels of time of abrasive surface preparation.

FIG. 14A shows the exposure level 174 of carbon fibers 80 at a no exposure level 174a and with the level 57 of time of abrading 48, such as sanding 48a, at 0 SEC (zero second) (no sanding) 57a.

In FIGS. 14B-14F, abrasive surface preparation 42 (see FIG. 3B), such as sanding surface preparation 42a (see FIG. 3B), was performed on the composite surfaces 26 (see FIGS. 14A-14F), such as the carbon fiber epoxy composite surface 26c (see FIGS. 14A-14F), by abrading 48 (see FIG. 3B), such as sanding 48a (see FIG. 3B), with 180 grit aluminum oxide sand paper and an abrading device 104 (see FIG. 3B), such as a random orbital sander (ROS) 104a (see FIG. 3B). The abrading 48, such as sanding 48a, removed a surface layer 176 (see FIG. 14A) of resin 82, such as epoxy resin 82a, to expose the carbon fibers 80 (see FIGS. 14CB-14F), such as the conductive carbon fibers 80b (see FIGS. 14C-14F). Electrical resistance 68 (see FIG. 3B) was measured before and after the abrasive surface preparation 42, such as the sanding surface preparation 42a, using the surface analysis tool 60 comprising the ohm meter 66 (see FIG. 3B), such as the electrical resistance ohm meter 66a (see FIG. 3B). Electrical resistance 68 decreased as more conductive carbon fibers 80b were exposed.

Figure 14B:
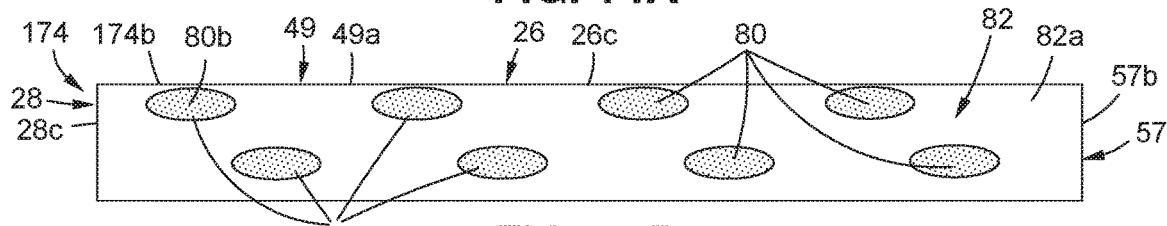

FIG. 14B shows the exposure level 174 of carbon fibers 80, such as conductive carbon fibers 80b, at a first exposure level 174b, and with the level 57 of time of abrading 48, such as sanding 48a, at 5 SEC (five seconds) 57b.

Figure 14C:
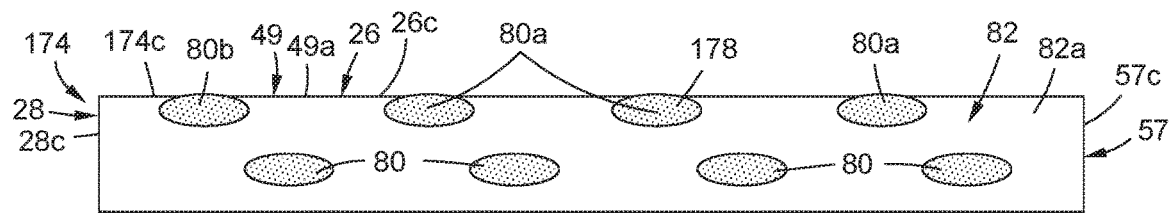

FIG. 14C shows the exposure level 174 of carbon fibers 80, such as conductive carbon fibers 80b, at a second exposure level 174c, and with the level 57 of time of abrading 48, such as sanding 48a, at 10 SEC (ten seconds) 57c.

Figure 14D:
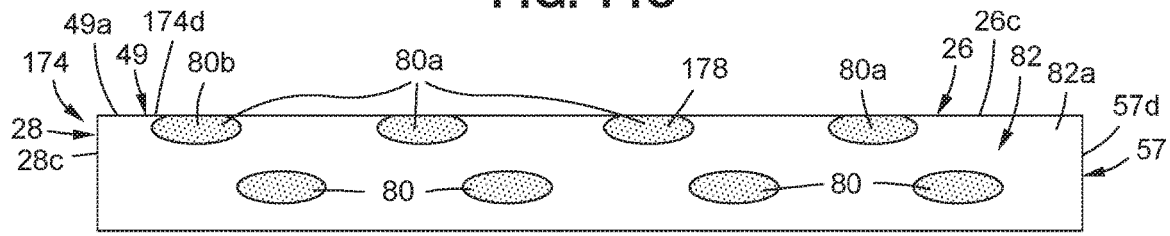

FIG. 14D shows the exposure level 174 of carbon fibers 80, such as conductive carbon fibers 80b, at a third exposure level 174d, and with the level 57 of time of abrading 48, such as sanding 48a, at 30 SEC (thirty seconds) 57d.

Figure 14E:
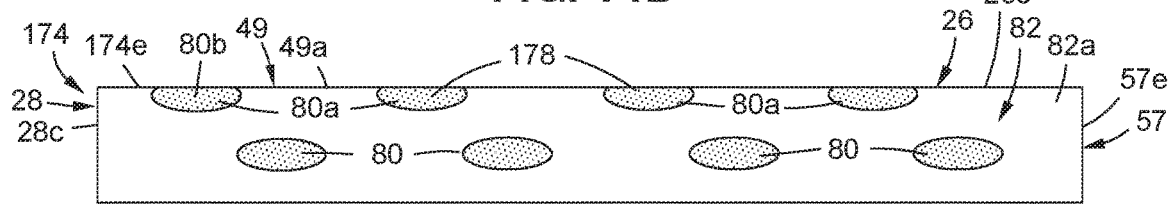

FIG. 14E shows the exposure level 174 of carbon fibers 80, such as conductive carbon fibers 80b, at a fourth exposure level 174e, and with the level 57 of time of abrading 48, such as sanding 48a, at 1 MIN (one minute) 57e.

Figure 14F:
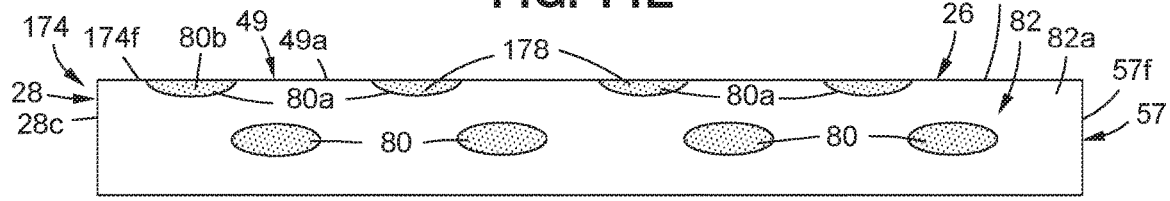

FIG. 14F shows the exposure level 174 of carbon fibers 80, such as conductive carbon fibers 80b, at a fifth exposure level 174f and with the level 57 of time of abrading 48, such as sanding 48a, at 2 MIN (two minutes) 57f.

Figure 15:
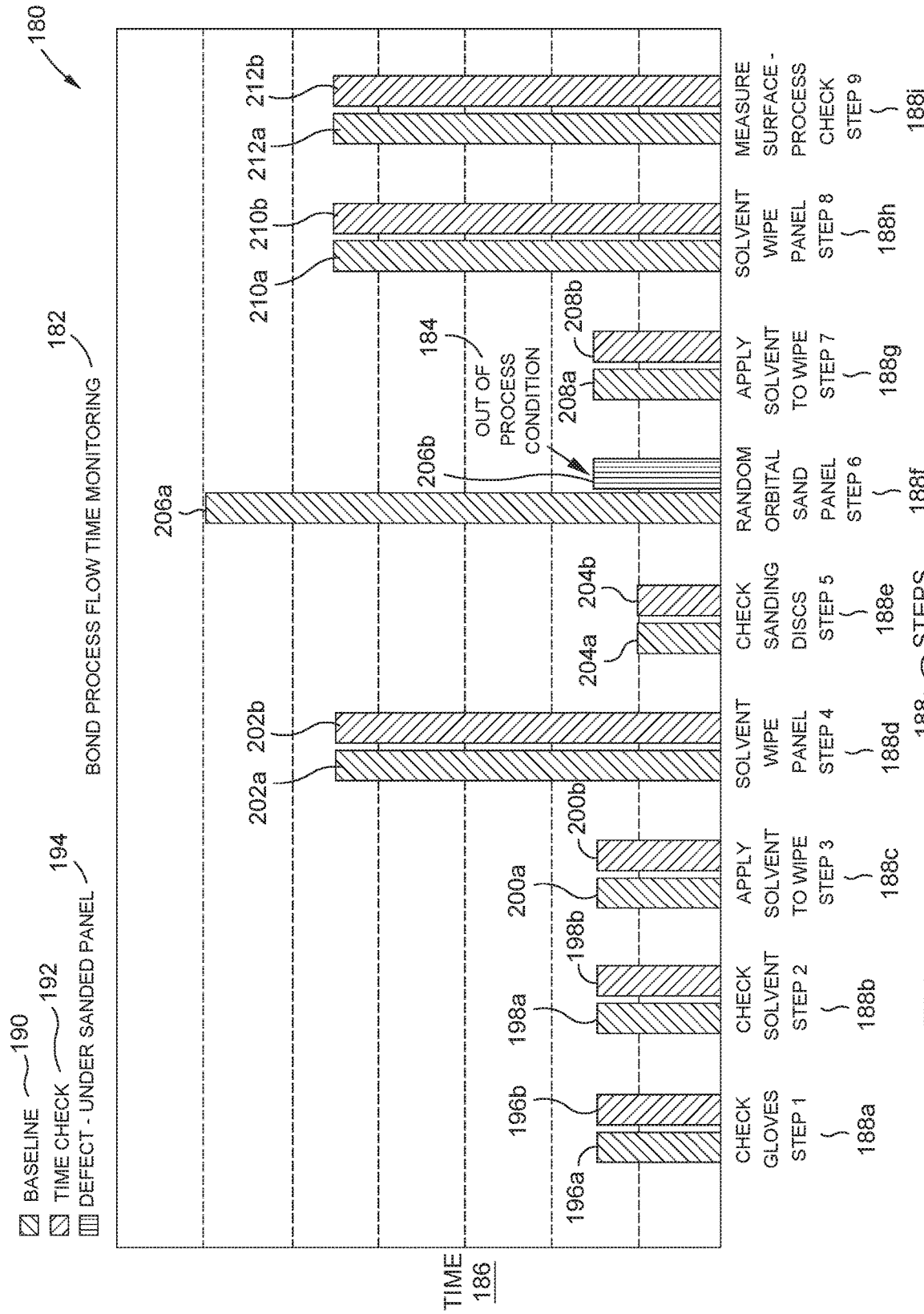
FIG. 15 is an illustration of a graph of an exemplary bond process flow time monitoring showing an out of process condition.

Now referring to FIG. 15, FIG. 15 is an illustration of a graph 180 of an exemplary bond process flow time monitoring 182 showing an out of process condition 184, in the form of a defect—under sanded panel 194. Tracking process flow time is another method of assessing bond process reliability and consistency. If a process step falls outside the normal, known flow time, it is flagged. An example of an output from the bond process flow time monitoring 182 is shown in FIG. 15, where the identification of a defect—under sanded panel 194 is made.

As shown in FIG. 15, the graph 180 shows time 186 on the y-axis, and shows steps 188 of the exemplary bond process flow time monitoring 182 on the x-axis. As further shown in FIG. 15, the steps 188 include step 1-check gloves 188a, step 2-check solvent 188b, step 3-apply solvent to wiper 188c, step 4-solvent wipe panel 188d, step 5-check sanding discs 188e, step 6-random orbital sand panel 188f, step 7-apply solvent to wiper 188g, step 8-solvent wipe panel 188h, and step 9-measure surface-process check 188i. As further shown in FIG. 15, each step 188 is designed to include a baseline 190, and designed to include a time check 192 that should meet, or be equal to, the baseline 190. For example, as shown in FIG. 15, step 1-check gloves 188a includes a baseline plot 196a and a time check plot 196b that are equal; step 2-check solvent 188b includes a baseline plot 198a and a time check plot 198b that are equal; step 3-apply solvent to wiper 188c includes a baseline plot 200a and a time check plot 200b that are equal; step 4-solvent wipe panel 188d includes a baseline plot 202a and a time check plot 202b that are equal; step 5-check sanding discs 188e includes a baseline plot 204a and a time check plot 204b that are equal; step 7-apply solvent to wiper 188g includes a baseline plot 208a and a time check plot 208b that are equal; step 8-solvent wipe panel 188h includes a baseline plot 210a and a time check plot 210b that are equal; and step 9-measure surface-process check 188i includes a baseline plot 212a and a time check plot 212b that are equal. However, as shown by FIG. 15, step 6-random orbital sand panel 188f includes a baseline plot 206a that is not the same as, or equal to, a plot 206b which indicates the defect—under sanded panel 194 and is the out of process condition 184.

The measurements 64 (see FIG. 3B), such as the test result measurements 64a (see FIG. 3B) of the surface analysis tool 60 comprising the ohm meter 66, used in the method 10 (see FIG. 1), the quantitative method 10a (see FIG. 2), and the system 90 (see FIGS. 3A, 3B), discussed above, provide for a go/no go process tool after the abrasive surface preparation 42 (see FIG. 3B), such as the sanding surface preparation 42a (see FIG. 3B), of the composite surface 26 (see FIG. 3A), such as the test composite surface 26a (see FIG. 3A).

The pre-bond surface check of the composite surface 26, with the surface analysis tool 60 comprising the ohm meter 66, may be incorporated into an optically enhanced bonding workstation, or, for example, may be incorporated into a method of monitoring and verifying a manufacturing process, as disclosed in U.S. Pat. No. 9,591,273, the content of which is hereby incorporated by reference in its entirety.

Preferably, the surface analysis tool 60 (see FIG. 3B) comprising the ohm meter 66, and the monitoring outputs of the surface analysis tool 60 comprising the ohm meter 66, are integrated into the process control system 90a (see FIG. 3A). The intent of the stepwise bond process control development is its implementation in the actual production of bonded parts, for example, the optically enhanced bonding work station. The functionality of the system 90 (see FIGS. 3A, 3B) includes process flow time monitoring, documentation of the process steps, as well as in-line process checks.

Figure 16:
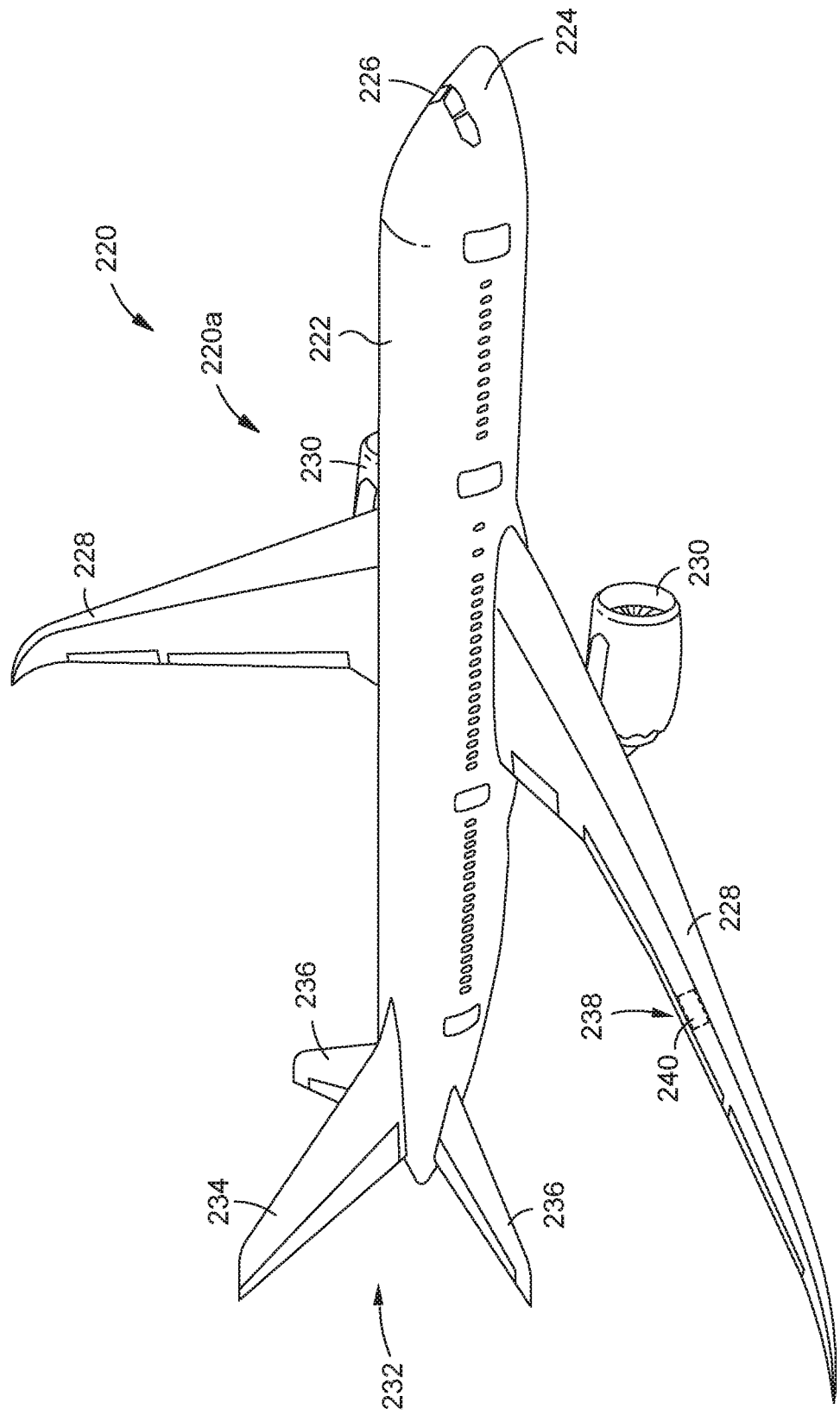
FIG. 16 is an illustration of a perspective view of an air vehicle incorporating one or more parts that may be manufactured using an exemplary version of an in-line process control check of the disclosure.

Now referring to FIG. 16, FIG. 16 is an illustration of a perspective view of an air vehicle 220, such as in the form of aircraft 220a, that incorporates one or more parts 238, such as one or more bonded parts 240, manufactured using an exemplary version of an in-line process control check 92 (see FIG. 3A) of the disclosure.

As shown in FIG. 16, the air vehicle 220, such as in the form of aircraft 220a, comprises a fuselage 222, a nose 224, a cockpit 226, wings 228, engines 230, and an empennage 232 comprising a vertical stabilizer 234 and horizontal stabilizers 236. The air vehicle 220 (see FIG. 16), such as in the form of aircraft 220a (see FIG. 16), comprises one or more parts 238, such as the one or more bonded parts 240, installed within the aircraft 220a, or alternatively, installed in the engines 230, the wings 228, the empennage 232, or other suitable areas of the aircraft 220a.

Figure 17:
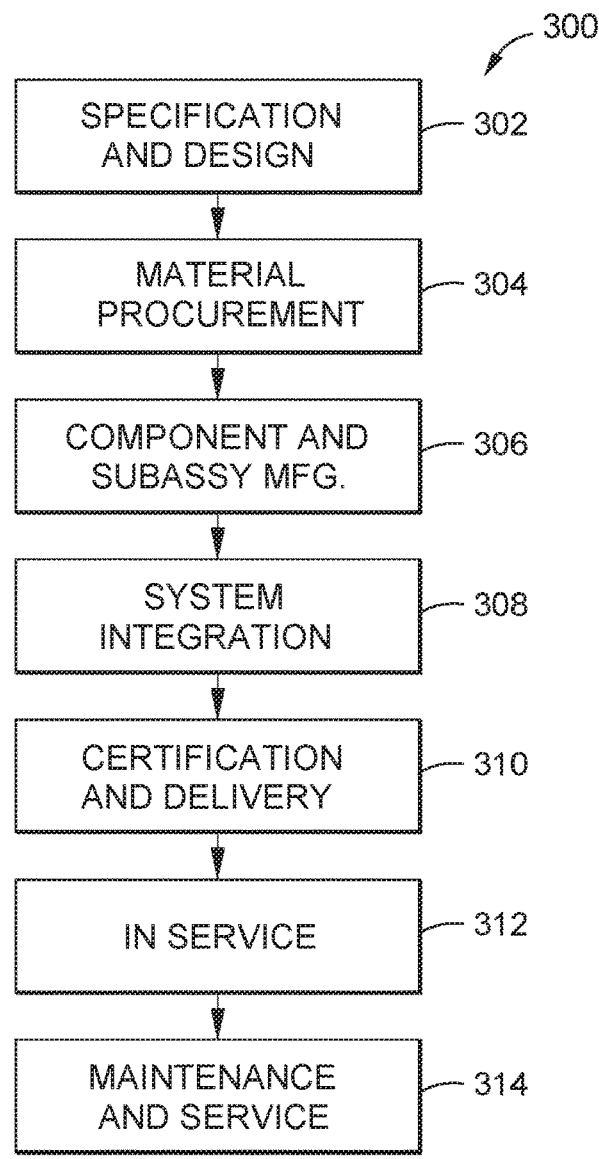
FIG. 17 is an illustration of a flow diagram of an exemplary aircraft manufacturing and service method.
Figure 18:
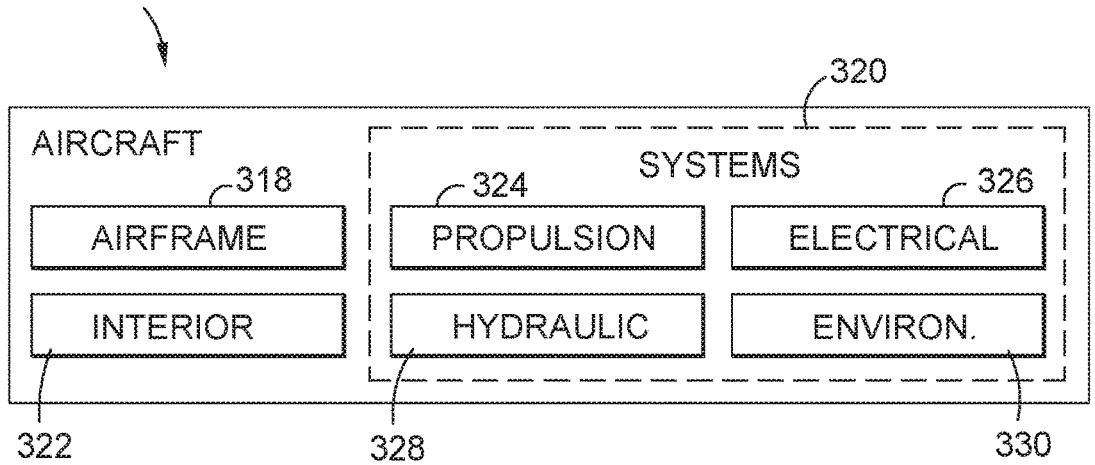
FIG. 18 is an illustration of an exemplary block diagram of an aircraft.

Now referring to FIGS. 17 and 18, FIG. 17 is an illustration of a flow diagram of an exemplary aircraft manufacturing and service method 300, and FIG. 18 is an illustration of an exemplary block diagram of an aircraft 316. Referring to FIGS. 17 and 18, versions of the disclosure may be described in the context of the aircraft manufacturing and service method 300 as shown in FIG. 17, and the aircraft 316 as shown in FIG. 18.

During pre-production, exemplary aircraft manufacturing and service method 300 may include specification and design 302 of the aircraft 316 and material procurement 304. During manufacturing, component and subassembly manufacturing 306 and system integration 308 of the aircraft 316 takes place. Thereafter, the aircraft 316 may go through certification and delivery 310 in order to be placed in service 312. While in service 312 by a customer, the aircraft 316 may be scheduled for routine maintenance and service 314 (which may also include modification, reconfiguration, refurbishment, and other suitable services).

Each of the processes of the aircraft manufacturing and service method 300 may be performed or carried out by a system integrator, a third party, and/or an operator (e.g., a customer). For the purposes of this description, a system integrator may include, without limitation, any number of aircraft manufacturers and major-system subcontractors. A third party may include, without limitation, any number of vendors, subcontractors, and suppliers. An operator may include an airline, leasing company, military entity, service organization, and other suitable operators.

As shown in FIG. 18, the aircraft 316 produced by the exemplary aircraft manufacturing and service method 300 may include an airframe 318 with a plurality of systems 320 and an interior 322. Examples of the plurality of systems 320 may include one or more of a propulsion system 324, an electrical system 326, a hydraulic system 328, and an environmental system 330. Any number of other systems may be included. Although an aerospace example is shown, the principles of the disclosure may be applied to other industries, such as the automotive industry.

Methods and systems embodied herein may be employed during any one or more of the stages of the aircraft manufacturing and service method 300. For example, components or subassemblies corresponding to component and subassembly manufacturing 306 may be fabricated or manufactured in a manner similar to components or subassemblies produced while the aircraft 316 is in service 312. Also, one or more apparatus embodiments, method embodiments, or a combination thereof, may be utilized during component and subassembly manufacturing 306 and system integration 308, for example, by substantially expediting assembly of or reducing the cost of the aircraft 316. Similarly, one or more of apparatus embodiments, method embodiments, or a combination thereof, may be utilized while the aircraft 316 is in service 312, for example and without limitation, to maintenance and service 314.

Disclosed versions of the method 10 (see FIG. 1), the quantitative method 10a (see FIG. 2), and the system 90 (see FIGS. 3A, 3B) provide for detecting levels 56 (see FIG. 3B) of the amount of abrasive surface preparation 42 (see FIG. 3B), such as sanding surface preparation 42a (see FIG. 3B), for composite surfaces 26 (see FIG. 3A), such as test composite surfaces 26a (see FIG. 3A), for example, carbon fiber epoxy composite surfaces 26c (see FIG. 3A), using electrical resistance 68 (see FIG. 3B) at the composite surface 26. Electrical resistance measurements 72 (see FIG. 3B) of the composite surfaces 26 may be taken using a point-to-point probe method 76 with an electrical resistance ohm meter 66a (see FIG. 3B) and point probes 78 (see FIG. 3B) on the composite surface 26 and the edge 27 (see FIG. 3A), respectively, of the test composite structure 28a (see FIG. 3A).

In addition, disclosed versions of the method 10 (see FIG. 1), the quantitative method 10a (see FIG. 2), and the system 90 (see FIGS. 3A, 3B) provide for detecting levels 57 (see FIG. 3B) of the time of abrasive surface preparation 42, such as sanding surface preparation 42a, for composite surfaces 26, such as test composite surfaces 26a, for example, carbon fiber epoxy composite surfaces 26c, using surface resistivity 70 (see FIG. 3B) at the composite surface 26. Surface resistivity measurements 74 of the composite surfaces 26 may be taken using a weighted probe method 84 (see FIG. 3B) with a surface resistivity ohm meter 66b (see FIG. 3B) and a surface resistivity probe 85 (see FIG. 3B), such as a weighted surface resistivity probe 85a (see FIG. 3B).

In addition, disclosed versions of the method 10 (see FIG. 1), the quantitative method 10a (see FIG. 2), and the system 90 (see FIGS. 3A, 3B) provide for the detection of a level 55 (see FIG. 3B), such as a test result level 58 (see FIG. 3B) of abrasive surface preparation 42 (see FIG. 3B), such as sanding surface preparation 42a (see FIG. 3B), grit blasting surface preparation 42b (see FIG. 3B), nylon pad abrasive surface preparation 42c (see FIG. 3B), plasma treatment surface preparation 42d (see FIG. 3B), laser ablation surface preparation 42e (see FIG. 3B), or another suitable abrasive surface preparation with an abrading device 104 (see FIG. 3B), or abrasive media tool, that physically abrades the composite surface 26 (see FIG. 3A), to prevent under sanding or over sanding of the composite surface 26, prior to a post-processing operation 50 (see FIG. 3B), such as bonding 52 (see FIG. 3B) or organic finishing 53 (see FIG. 3B), such as painting 53a (see FIG. 3B). Thus, disclosed versions of the method 10 (see FIG. 1), the quantitative method 10a (see FIG. 2), and the system 90 (see FIGS. 3A, 3B) verify abrasive surface preparation 42, such as sanding surface preparation 42a, of composite surfaces 26, such as test composite surfaces 26a, for example, carbon fiber epoxy composite surfaces 26c, prior to a post-processing operation 50 (see FIG. 3B), such as bonding 52 (see FIG. 3B), or organic finishing 53 (see FIG. 3B), such as painting 53a (see FIG. 3B).

Moreover, disclosed versions of the method 10 (see FIG. 1), the quantitative method 10a (see FIG. 2), and the system 90 (see FIGS. 3A, 3B) reduce cost and flow time by verifying a reliable and robust process has been performed, eliminating rework, and preventing quality control issues upstream. Further, disclosed versions of the method 10 (see FIG. 1), the quantitative method 10a (see FIG. 2), and the system 90 (see FIGS. 3A, 3B) verify robust abrasive surface preparation or treatment of carbon fiber epoxy substrates has been performed correctly prior to subsequent process steps such as adhesive bonding 52b (see FIG. 3B) or application of organic finishes 54 (see FIG. 3B), such as paint 54a (see FIG. 3B), and result in robust, consistent, and reliable bonding 52 or organic finishing 53, such as painting 53a, through process control. A portable, pre-bond surface analysis tool 60 comprising an ohm meter 66 (see FIG. 3B), may be used for in-line bond process control of abrading 48 (see FIG. 3B), such as sanding 48a (see FIG. 3B), of composite surfaces 26, such as carbon fiber epoxy composite surfaces 26c (see FIG. 3A). The surface analysis tool 60 comprising the ohm meter 66 detects target values 62 (see FIG. 3B), or threshold limits, for a plurality of levels 55 (see FIG. 3B) of abrasive surface preparation 42 (see FIG. 3B), such as sanding surface preparation 42a (see FIG. 3B), using electrical resistance 68 (see FIG. 3B) or surface resistivity 70 (see FIG. 3B) of composite surfaces 26 (see FIG. 3A) that have been abraded 48 (see FIG. 3B) or sanded 48a (see FIG. 3B).

Further, disclosed versions of the method 10 (see FIG. 1), the quantitative method 10a (see FIG. 2), and the system 90 (see FIGS. 3A, 3B) use the surface analysis tool 60 (see FIG. 3B) comprising the ohm meter 66 (see FIG. 3B), such as the electrical resistance ohm meter 66a (see FIG. 3B) or the surface resistivity ohm meter 66b (see FIG. 3B), on composite surfaces 26 to quantify the degree of abrasion on the composite surface 26 prior to undergoing the post-processing operation 50, such as bonding 52 or organic finishing 53. The ohm meter 66 measures conductivity of the carbon fibers 80 (see FIG. 3A), which are less resistive as more carbon fibers 80 are exposed.

In addition, disclosed versions of the method 10 (see FIG. 1), the quantitative method 10a (see FIG. 2), and the system 90 (see FIGS. 3A, 3B) provide for the use of the surface analysis tool 60 comprising the ohm meter 66, in a quality assurance methodology, or for incorporation into an optically enhanced bonding workstation. Quantitative measurement of abrasive surface preparation 42 (see FIG. 3B), such as sanding surface preparation 42a (see FIG. 3B), grit blasting surface preparation 42b (see FIG. 3B), nylon pad abrasive surface preparation 42c (see FIG. 3B), plasma treatment surface preparation 42d (see FIG. 3B), laser ablation surface preparation 42e (see FIG. 3B), or another suitable abrasive surface preparation with an abrading device 104 (see FIG. 3B), or an abrasive media tool, that physically abrades the composite surface 26 (see FIG. 3A) ensures the quality 24 (see FIG. 3A) of subsequent adhesive bonding of the composite surface 26 to another structure 40 (see FIG. 3A), such as an aircraft structure 40a (see FIG. 3A).

Moreover, disclosed versions of the method 10 (see FIG. 1), the quantitative method 10a (see FIG. 2), and the system 90 (see FIGS. 3A, 3B) may provide a reduced variability in abrasive surface preparation 42 methods, to produce robust bonded joints and robust bonded parts 240 (see FIG. 16), and to promote reliable adhesion, and to ensure that the composite surface 26 (see FIG. 3A) has been properly prepared before the post-processing operation 50 (see FIG. 3B), such as bonding 52 (see FIG. 3B) or organic finishing 53 (see FIG. 3B), such as painting 53a (see FIG. 3B). Further, disclosed versions of the method 10 (see FIG. 1), the quantitative method 10a (see FIG. 2), and the system 90 (see FIGS. 3A, 3B) may mitigate any risks associated with bond processing through an in-line bond process monitoring system, and may define the processing window and control the fabrication steps to ensure a repeatable, reliable, and consistent bonding process, and define the quantitative outputs from the surface analysis tool measurements and outputs for integration into the process control system 90a (see FIG. 3A) as "go/no go" process checks. The intention of the in-line process control check 92 (see FIG. 3A) is definition and control of process limits, resulting in consistent and reliable production of robust bonds.

In addition, disclosed versions of the method 10 (see FIG. 1), the quantitative method 10a (see FIG. 2), and the system 90 (see FIGS. 3A, 3B) provide a framework for implementation of bond process control on any bonding system and ultimately allow for certification of robust bonded structures and bonded parts 240 (see FIG. 16) and ensure the quality of aircraft structural adhesive bonds. Any aerospace manufacturer, or other manufacturer, such as an automotive manufacturer, that utilizes abrasive surface preparation 42, such as sanding surface preparation 42a, grit blasting surface preparation 42b, nylon pad abrasive surface preparation 42c, plasma treatment surface preparation 42d, laser ablation surface preparation 42e, or another suitable abrasive surface preparation with an abrading device 104, or abrasive media tool, of composite surfaces may have the ability to utilize disclosed versions of the method 10 (see FIG. 1), the quantitative method 10a (see FIG. 2), and the system 90 (see FIGS. 3A, 3B). Disclosed versions of the method 10 (see FIG. 1), the quantitative method 10a (see FIG. 2), and the system 90 (see FIGS. 3A, 3B) may enable rapid certification of bonded structures and bonded parts 240 (see FIG. 16) by validating robust and reliable bond processing, such as aircraft structural adhesive bond processing, prior to launching certification testing. Further, disclosed versions of the method 10 (see FIG. 1), the quantitative method 10a (see FIG. 2), and the system 90 (see FIGS. 3A, 3B) provide an approach that may be used to verify or certify the integrity of structural bonds for various applications, such as transportation applications, including aircraft, automotive, and water craft; architectural, including buildings and bridges; and other suitable applications requiring verification or certification of the integrity of structural bonds.

Many modifications and other versions of the disclosure will come to mind to one skilled in the art to which this disclosure pertains having the benefit of the teachings presented in the foregoing descriptions and the associated drawings. The versions described herein are meant to be illustrative and are not intended to be limiting or exhaustive. Although specific terms are employed herein, they are used in a generic and descriptive sense only and not for purposes of limitation.

What is claimed is:

1. A method for determining a quality of an abrasive surface preparation of a composite surface, prior to the composite surface undergoing a post-processing operation, the method comprising:
fabricating a plurality of levels of abrasive surface preparation standards for a reference composite surface of one or more reference composite structures;
using a surface analysis tool comprising an ohm meter, to create one or more target values for quantifying the plurality of levels of the abrasive surface preparation standards;
measuring, with the surface analysis tool comprising the ohm meter, one or more abrasive surface preparation locations on the composite surface of a test composite structure, to measure one or more of, electrical resistance and surface resistivity, of the composite surface, to obtain one or more test result measurements, and to detect one of, levels of an amount of the abrasive surface preparation of the composite surface, and levels of a time of the abrasive surface preparation of the composite surface;
comparing the one or more test result measurements to the plurality of levels of the abrasive surface preparation standards, to obtain one or more test result levels of the abrasive surface preparation of the test composite structure;
determining if the one or more test result levels of the abrasive surface preparation meet the one or more target values, to determine the quality of the abrasive surface preparation of the composite surface; and
determining whether the composite surface of the test composite structure is acceptable to proceed with undergoing the post-processing operation.

2. The method of claim 1, wherein measuring, with the surface analysis tool comprising the ohm meter, further comprises, measuring the electrical resistance of the composite surface using a point-to-point probe method with a first point probe and a second point probe in contact with exposed carbon fibers on the composite surface and on an edge, respectively, of the test composite structure.

3. The method of claim 1, wherein measuring, with the surface analysis tool comprising the ohm meter, further comprises, measuring the electrical resistance of the composite surface with the ohm meter comprising an electrical resistance ohm meter, and measuring the surface resistivity of the composite surface with the ohm meter comprising a surface resistivity ohm meter.

4. The method of claim 1, wherein measuring, with the surface analysis tool comprising the ohm meter, further comprises, measuring the surface resistivity of the composite surface using a weighted probe method with a surface resistivity probe in contact with one of the one or more abrasive surface preparation locations on the composite surface, and with a weight placed on the surface resistivity probe, to apply a controlled pressure to the surface resistivity probe, during measuring.

5. The method of claim 4, wherein measuring the surface resistivity of the composite surface using the weighted probe method further comprises, placing the weight comprising a twenty pound (20 lb.) weight on the surface resistivity probe, during measuring.

6. The method of claim 4, wherein measuring the surface resistivity of the composite surface using the weighted probe method further comprises, placing the weight comprising a forty pound (40 lb.) weight on the surface resistivity probe, during measuring.

7. The method of claim 1, wherein measuring the one or more abrasive surface preparation locations on the composite surface of the test composite structure further comprises, measuring the one or more abrasive surface preparation locations on the composite surface of the test composite structure comprising a carbon fiber epoxy composite panel.

8. The method of claim 1, wherein determining whether the composite surface of the test composite structure is acceptable to proceed with undergoing the post-processing operation further comprises, determining whether the composite surface is acceptable to proceed with undergoing the post-processing operation comprising bonding the composite surface to a structure, including one of, paste bonding, and adhesive bonding, the composite surface to the structure.

9. The method of claim 1, wherein determining whether the composite surface of the test composite structure is acceptable to proceed with undergoing the post-processing operation further comprises, determining whether the composite surface is acceptable to proceed with undergoing the post-processing operation comprising applying an organic finish to the composite surface.

10. A quantitative method for determining a quality of a sanding surface preparation of a carbon fiber composite surface, prior to bonding the carbon fiber composite surface to a structure, the quantitative method comprising:
fabricating a plurality of levels of sanding surface preparation standards for a reference carbon fiber composite surface of one or more reference carbon fiber composite structures;
using a surface analysis tool comprising an ohm meter, to create one or more target values for quantifying the plurality of levels of the sanding surface preparation standards;
measuring, with the surface analysis tool comprising the ohm meter, one or more sanding surface preparation locations on the carbon fiber composite surface of a test carbon fiber composite structure, to measure one or more of, electrical resistance and surface resistivity, of the carbon fiber composite surface, to obtain one or more test result measurements, and to detect one of, levels of an amount of the sanding surface preparation of the carbon fiber composite surface, and levels of a time of the sanding surface preparation of the carbon fiber composite surface;
comparing the one or more test result measurements to the plurality of levels of the sanding surface preparation standards, to obtain one or more test result levels of the sanding surface preparation of the test carbon fiber composite structure;
determining if the one or more test result levels of the sanding surface preparation meet the one or more target values, to determine the quality of the sanding surface preparation of the carbon fiber composite surface; and
determining whether the carbon fiber composite surface of the test carbon fiber composite structure is acceptable to proceed with bonding to the structure.

11. The quantitative method of claim 10, wherein measuring, with the surface analysis tool comprising the ohm meter, further comprises, measuring the electrical resistance of the carbon fiber composite surface using a point-to-point probe method with a first point probe and a second point probe in contact with exposed carbon fibers on the carbon fiber composite surface and on an edge, respectively, of the test carbon fiber composite structure.

12. The quantitative method of claim 10, wherein measuring, with the surface analysis tool comprising the ohm meter, further comprises, measuring the surface resistivity of the carbon fiber composite surface using a weighted probe method, with a surface resistivity probe in contact with one of the one or more sanding surface preparation locations on the carbon fiber composite surface, and with a weight placed on the surface resistivity probe, to apply a controlled pressure to the surface resistivity probe, during measuring.

13. The quantitative method of claim 12, wherein measuring the surface resistivity of the carbon fiber composite surface using the weighted probe method further comprises, placing the weight comprising one of, a twenty pound (20 lb.) weight or a forty pound (40 lb.) weight, on the surface resistivity probe, during measuring.

14. The quantitative method of claim 10, wherein measuring the one or more sanding surface preparation locations on the carbon fiber composite surface of the test carbon fiber composite structure further comprises, measuring the one or more sanding surface preparation locations on the carbon fiber composite surface of the test carbon fiber composite structure comprising a carbon fiber epoxy composite panel.

15. A system for determining a quality of an abrasive surface preparation of a composite surface, prior to the composite surface undergoing a post-processing operation, the system comprising:
- a reference composite structure having a reference composite surface;
- a plurality of levels of abrasive surface preparation standards fabricated for the reference composite surface;
- a test composite structure having the composite surface, and the composite surface having one or more abrasive surface preparation locations that have been abraded with an abrading device; and
- a surface analysis tool comprising an ohm meter, to create one or more target values for quantifying the plurality of levels of the abrasive surface preparation standards, and the surface analysis tool comprising the ohm meter is configured to measure the one or more abrasive surface preparation locations on the composite surface of the test composite structure, and to measure one or more of, electrical resistance and surface resistivity, of the composite surface, to obtain one or more test result measurements, and to detect one of, levels of an amount of the abrasive surface preparation of the composite surface, and levels of a time of the abrasive surface preparation of the composite surface,
- wherein the one or more test result measurements is compared to the plurality of levels of the abrasive surface preparation standards, to obtain one or more test result levels of the abrasive surface preparation of the test composite structure, and to determine if the one or more test result levels meet the one or more target values, to determine the quality of the abrasive surface preparation of the composite surface, and to determine if the composite surface is acceptable to proceed with undergoing the post-processing operation.

16. The system of claim 15, wherein the surface analysis tool comprising the ohm meter, measures the electrical resistance of the composite surface using a point-to-point probe method with a first point probe and a second point probe in contact with exposed carbon fibers on the composite surface and on an edge, respectively, of the test composite structure.

17. The system of claim 15, wherein the surface analysis tool comprising the ohm meter, measures the surface resistivity of the composite surface using a weighted probe method with a surface resistivity probe in contact with one of the one or more abrasive surface preparation locations on the composite surface, and with a weight placed on the surface resistivity probe, to apply a controlled pressure to the surface resistivity probe, during measuring.

18. The system of claim 17, wherein the weight placed on the surface resistivity probe during measurement of the surface resistivity comprises a twenty pound (20 lb.) weight.

19. The system of claim 17, wherein the weight placed on the surface resistivity probe during measurement of the surface resistivity comprises a forty pound (40 lb.) weight.

20. The system of claim 15, wherein the post-processing operation comprises one or more of, bonding the composite surface to a structure, and applying a paint to the composite surface.

* * * * *